US011081159B1

(12) United States Patent
Jähne et al.

(10) Patent No.: US 11,081,159 B1
(45) Date of Patent: Aug. 3, 2021

(54) MEMORY CELL ARRANGEMENT AND METHODS THEREOF

(71) Applicant: Ferroelectric Memory GmbH, Dresden (DE)

(72) Inventors: Rolf Jähne, Dresden (DE); Marko Noack, Dresden (DE)

(73) Assignee: FERROELECTRIC MEMORY GMBH, Dresden (DE)

(*) Notice: Subject to any disclaimer, the term of this patent is extended or adjusted under 35 U.S.C. 154(b) by 0 days.

(21) Appl. No.: 16/929,932

(22) Filed: Jul. 15, 2020

(51) Int. Cl.
| G11C 11/22 | (2006.01) |
| H01L 49/02 | (2006.01) |
| H01L 29/786 | (2006.01) |
| H01L 29/423 | (2006.01) |
| H01L 29/78 | (2006.01) |
| H01L 29/06 | (2006.01) |

(52) U.S. Cl.
CPC ........ G11C 11/2273 (2013.01); G11C 11/223 (2013.01); G11C 11/2255 (2013.01); *H01L 28/60* (2013.01); *H01L 29/0673* (2013.01); *H01L 29/42392* (2013.01); *H01L 29/7851* (2013.01); *H01L 29/78391* (2014.09); *H01L 29/78696* (2013.01)

(58) Field of Classification Search
CPC .................................................. G11C 11/2273
USPC ........................................................ 365/145
See application file for complete search history.

(56) References Cited

U.S. PATENT DOCUMENTS

| 5,719,520 | A | * | 2/1998 | Au | ....................... G11C 11/5621 |
| | | | | | 327/427 |
| 6,479,862 | B1 | * | 11/2002 | King | ................. H01L 29/42332 |
| | | | | | 257/295 |
| 2005/0088878 | A1 | * | 4/2005 | Eshel | ..................... G11C 16/28 |
| | | | | | 365/185.28 |
| 2010/0085806 | A1 | * | 4/2010 | Wang | .................. G11C 11/4085 |
| | | | | | 365/182 |
| 2010/0258794 | A1 | * | 10/2010 | Iwasaki | ............... H01L 29/7869 |
| | | | | | 257/43 |

OTHER PUBLICATIONS

Massoud Pedram, "Leakage Power Modeling and Minimization", University of Southern California, Dept. of EE-Systems, Los Angeles, CA 90089, ICCAD 2004 Tutorial, www.ceng.usc.edu, Oct. 10, 2007, 43 pages.*

(Continued)

*Primary Examiner* — Muna A Techane
(74) *Attorney, Agent, or Firm* — Hickman Becker Bingham Ledesma LLP; Malgorzata A. Kulczycka

(57) ABSTRACT

A memory cell arrangement is provided that may include: a read-out circuit and a memory cell including: a first terminal, a second terminal, and a third terminal; the memory cell may be configured to control current flow between the second terminal and the first terminal as a function of a first voltage present at the first terminal, a third voltage applied at the third terminal, and a memory state of the memory cell. The read-out circuit is configured to: generate a characteristic voltage at the bitline by applying the third voltage at the third terminal and a second voltage at the second terminal, the characteristic voltage representing the memory state of the memory cell, and to determine the memory state of the memory cell based on sensing the characteristic voltage.

18 Claims, 15 Drawing Sheets

(56) References Cited

OTHER PUBLICATIONS

Junction Leakage and Gidl, "Reverse Biased Diode Current (Junction Leakage)", https://asic soc.blogspot.com/2008/04/reverse-biased-diode-current-junction.html last viewed on Jul. 15, 2020, 3 pages.*
Jan M Rabaey, Anantha Chandrakasan and Borivoje Nikolic, "Digital Integrated Circuits a Design Perspective", 2nd Edition, dated 2005, Prentice Hall, 448 pages.*
BSIM4.2.1 MOSFET Model, Department of Electrical Engineering and Computer Sciences University of California, Berkeley, dated 2001, 1 page.*

* cited by examiner

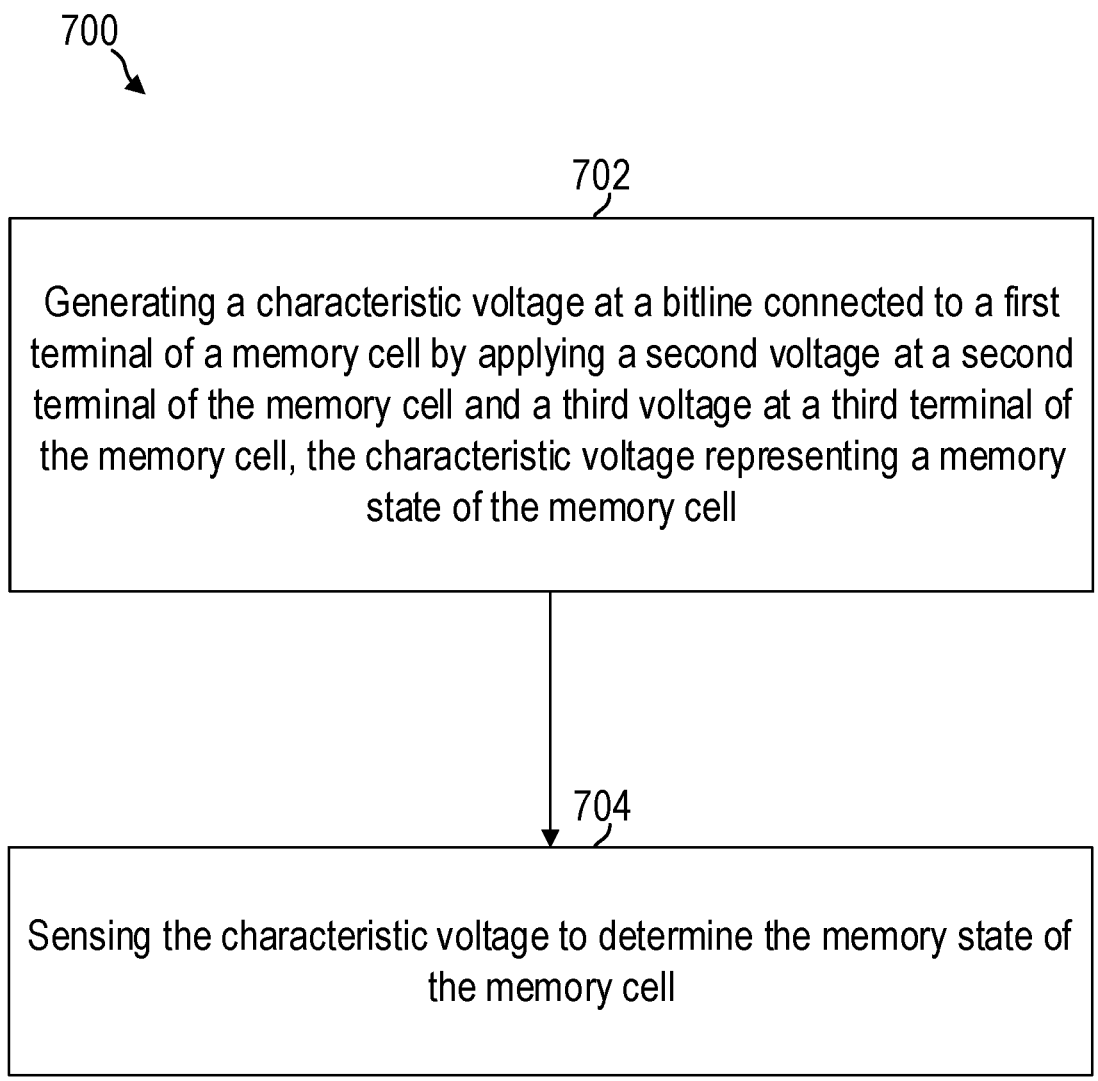

MEMORY CELL ARRANGEMENT AND METHODS THEREOF

TECHNICAL FIELD

Various aspects relate to a memory cell arrangement, and methods thereof, e.g., a method for reading a memory cell.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g., for writing (e.g., programming and/or erasing) and/or reading the respective memory cell or groups of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 7 shows a schematic flow diagram of a method for reading a memory cell, according to various aspects.

DESCRIPTION

Figure 1A:
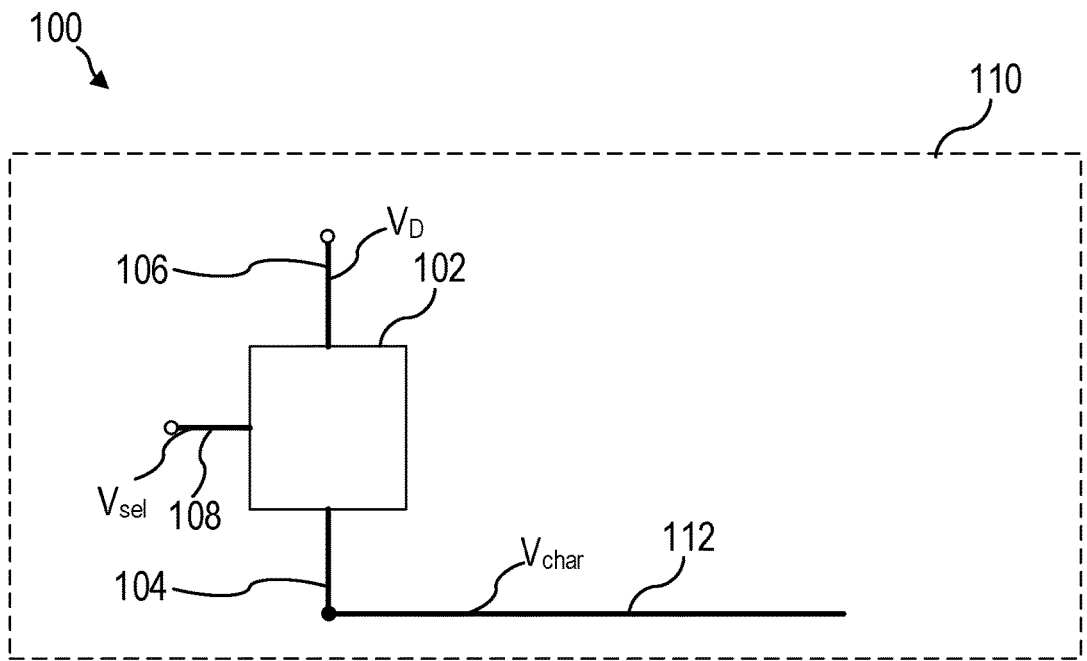
FIGS. 1A to 1E schematically show a memory cell arrangement, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g., arrangements). However, it may be understood that aspects described in connection with methods may similarly apply to the devices, and vice versa.

The terms "at least one" and "one or more" may be understood to include any integer number greater than or equal to one, i.e., one, two, three, four, [ . . . ], etc. The term "a plurality" may be understood to include any integer number greater than or equal to two, i.e., two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The phrase that an element or a group of elements "includes" another element or another group of elements may be used herein to mean that the other element or other group of elements may be part of the element or the group of elements or that the element or the group of elements may be configured or formed as the other element or the other group of elements (e.g., the element may be the other element).

The phrase "unambiguously assigned" may be used herein to mean a one-to-one-assignment (e.g., allocation, e.g., correspondence) or a bijective assignment. As an example, a first element being unambiguously assigned to a second element may include that the second element is unambiguously assigned to the first element. As another example, a first group of elements being unambiguously assigned to a second group of element may include that each element of the first group of elements is unambiguously assigned to a corresponding element of the second group of elements and that that corresponding element of the second group of elements is unambiguously assigned to the element of the first group of elements.

The term "connected" may be used herein with respect to nodes, integrated circuit elements, terminals, control lines, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The phrase "a current between" a first terminal or node and a second terminal or node may be used herein to mean a current from the first terminal or node to the second terminal or node as well as a current from the second terminal or node to the first terminal or node.

The terms "charging" or "discharging" an element having a capacitance associated therewith (such as a control line, an electrode, a terminal, etc., in an electronic circuit) may be used herein with respect to increase (in case of charging) or decrease (in case of discharging) the amount of electric charge stored in the element, for example. The electric charge stored in the element (based on the capacitance associated therewith) may be changed via a charging current or discharging current accordingly. In the case that an element having a capacitance associated therewith has an amount of electric charge stored therein, a corresponding voltage may be associated therewith as well. The relationship between a voltage of an element having a capacitance associated therewith (e.g., of a capacitor or an element having an inherent capacitance) and the electric charge stored therein may be determined based on commonly used equations considering the capacitance as a ratio of a change in electric charge to a corresponding change in the electric potential. The terms "charging" or "discharging" with reference to an element having a capacitance associated therewith may be used herein with respect to a technical current direction. The term "charge" or "charging" with reference to an element having a capacitance associated therewith, such as a control line, may be used herein to mean an increase of a voltage value being present (e.g., measureable) at the element, e.g., at the control line. The increase of the voltage value may mean a more positive voltage value: For example, an element having a capacitance associated therewith may be charged from a voltage value of −8V to a voltage value of −4V, from a voltage value of −2V to a voltage value of 2V, or from a voltage value of 3V to a voltage value of 6V (only as numerical examples). The term "discharge" or "discharging" with reference to an element having a capacitance associated therewith, such as a control line, may be used herein to mean a decrease of a voltage value being present (e.g., measureable) at the element, e.g., at the control line. The decrease of the voltage value may mean a more negative voltage value: For example, an element having a capacitance associated therewith may be discharged from a voltage value of 8V to a voltage value of 4V, from a voltage value of 2V to a voltage value of −2V, or from a voltage value of −3V to a voltage value of −6V (only as numerical examples).

The term "voltage" may be used herein with respect to "one or more bitline voltages", "one or more wordline voltages", "one or more plateline voltages", "one or more drainline voltages", "one or more control line voltages", "one or more base voltages", and the like. As an example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "control line voltage" may be used herein to denote a voltage that is provided to a control line, e.g., of a memory cell arrangement (for example a "wordline voltage" may be provided to a "wordline", a "bitline voltage" may be provided to a bitline, and a "drainline voltage" may be provided to a drainline).

Illustratively, a voltage provided to a node or a terminal may assume any suitable value depending on the intended operation of the circuit including the node or terminal. For example, a select voltage (referred to as $V_{sel}$) may be varied depending on the intended operation of the memory cell arrangement. For example, a bitline voltage (referred to as $V_{BL}$) may be varied depending on the intended operation of the memory cell arrangement. Analogously, a wordline voltage (referred to as $V_{WL}$) may be varied depending on the intended operation of a memory cell arrangement. Analogously, a source voltage (referred to as $V_S$) and/or a drain voltage (referred to as $V_D$) of a memory cell may be varied depending on the intended operation of the memory cell. A voltage provided to a node or terminal may be defined by the respective potential applied to that node or terminal relative to the base voltage (referred to as $V_B$) of the circuit. Further, a voltage or voltage drop associated with two distinct nodes or terminals of a circuit may be defined by the respective voltages applied at the two nodes or terminals. As an example, the term "control-source" voltage drop may be used to denote a voltage or voltage drop that is defined by respective voltages applied at a corresponding control terminal and a corresponding source terminal, e.g., being part of a memory cell structure. The control-source voltage drop may also be referred to as control-source voltage, $V_{CS}$.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values are considered for the comparison.

According to various aspects, a memory cell may include a transistor. A transistor may include or may be, for example, a field effect transistor (FET), such as an n-type or p-type field-effect transistor, or the like. A transistor may have a threshold voltage associated therewith. A threshold voltage of a transistor (e.g., a field-effect transistor) may be defined by the properties of the transistor (e.g., the field-effect transistor), such as the material(s), the doping(s), etc., and it may thus be a (e.g., intrinsic) property of the transistor.

As an example, a memory cell (e.g., a memory cell including an n-type or p-type field-effect transistor (FET)) may have a first threshold voltage (e.g., a low threshold voltage ($V_{L-th}$)), and a second threshold voltage (e.g., a high threshold voltage ($V_{H-th}$)). The high threshold voltage, $V_{H-th}$, may be different from the low threshold voltage, $V_{L-th}$. In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g. the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g. the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g. the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g. the $V_{L-th}$ may be 1 V and the $V_{H-th}$ may be −1 V, or the $V_{L-th}$ may be 2 V and the $V_{H-th}$ may be 0 V, or the $V_{L-th}$ may be 3 V and the $V_{H-th}$ may be 1 V, only as numerical examples).

According to various aspects, a threshold voltage of a memory cell (e.g., a memory cell including a field-effect transistor) may be defined as a constant-current threshold voltage (referred to as $V_{th(ci)}$). In the case of the memory cell including a field-effect transistor, the constant-current threshold voltage, $V_{th(ci)}$, may be a determined control-source voltage, $V_{CS}$, at which the current from source to drain (referred to as $I_D$) is equal to a predefined (constant) current. The predefined (constant) current may be a reference current (referred to as $I_{D0}$) times the ratio of gate width (W) to gate length (L) of the field-effect transistor. The magnitude of the reference current, $I_{D0}$, may be selected to be appropriate for a given technology, e.g. 0.1 µA. In some aspects, the constant-current threshold voltage, $V_{th(ci)}$, may be determined based on the following equation: $V_{th(ci)}=V_{CS}$ (at $I_D=I_{D0} \cdot W/L$). According to various aspects, the current from source to drain, $I_D$, may be determined by use of a source-drain voltage, $V_{SD}$ (e.g., a source-drain voltage drop across a source region and a drain region of the field-effect transistor) of about 0.1 V. In some aspects, the current from source to drain, $I_D$, may be determined by measuring the current that flows through a first terminal connected to the source and/or a second terminal connected to the drain in the case that the field-effect transistor of the memory cell is turned on. The current from source to drain, $I_D$, may be determined from a current/voltage measurement, wherein a current is measured that flows through the first terminal and/or the second terminal of the memory cell as a function of a voltage (e.g., $V_{GS}$) that control the switching of the field-effect transistor of the memory cell.

According to various aspects, a memory cell may have at least two distinct states associated therewith, for example with two distinct electrical conductivities that can be determined to evaluate in which of the at least two distinct states the memory cell is residing in. A memory cell in general may include a memory element (e.g., a memory layer), for example, a remanent-polarizable memory element, such as a ferroelectric or ferroelectric memory element. A memory cell may include remanent-polarizable portion, such as a ferroelectric portion. For example, the memory cell may include a ferroelectric field-effect transistor ("FeFET"). A memory cell may include a transistor that is coupled to a remanent-polarizable portion (e.g., the remanent-polarizable portion may be coupled to a gate or gate structure of the transistor). A memory cell may include at least a first memory state and a second memory state (e.g., a first memory state and a second memory state of the memory element). In some aspects, the memory state in which a memory cell is residing in may influence a current characteristic and/or voltage characteristic during readout of the memory cell. The first memory state may be, for example, associated with a logic "1" and the second memory state may be, for example, associated with a logic "0". However, the definition of the memory states and/or the definition of a logic "0" and a logic "1" may be selected arbitrarily.

A memory cell (for example a remanent-polarizable memory cell, such as a FeFET) may include a first memory state, e.g. a low threshold voltage state (referred to as LVT state), and a second memory state, e.g. a high threshold voltage state (referred to as HVT state).

According to various aspects, a remanent-polarizable memory cell may include a remanently-polarizable portion (also referred to as remanent-polarizable portion). The remanent-polarizable portion may be used to implement memory functions, e.g., in a memory cell. Therefore, according to various aspects, a memory cell may be implemented as a field-effect transistor structure, e.g., as a remanent-polarizable field effect transistor (e.g., a ferroelectric field effect transistor—"FeFET"). In general, a remanent polarization (also referred to as retentivity or remanence) may be present in a material portion (e.g., a material layer) in the case that the material may remain polarized upon reduction of an applied electric field, E, to zero; therefore, a certain value for the electrical polarization, P, of the material portion may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Further, a remanent-polarizable material may include a spontaneously polarization, for example, with reference to the polarization capability of a material beyond dielectric polarization. The coercivity of a material may be a measure of the strength of the reverse polarizing electric field that may be required to remove a remanent polarization. According to various aspects, an electric coercive field (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

The polarization state of the remanent-polarizable portion may be switched by means of a capacitor structure that may be included in a transistor structure or coupled to a transistor (e.g., coupled to a field-effect transistor). The polarization state of the remanent-polarizable portion may be read out by means of the transistor structure. The polarization state of the remanent-polarizable portion may define a memory state, e.g., of a memory cell. As an example, the polarization state of the remanent-polarizable portion may influence one or more electrical characteristics of the transistor structure, e.g., a current flowing through the transistor structure. For example, the polarization state of the remanent-polarizable portion may influence a threshold voltage of the transistor structure.

According to various aspects, writing a memory cell or performing a write operation of a memory cell may include an operation or a process that modifies the memory state the memory cell is residing in from a (e.g., first) memory state to another (e.g., second) memory state. For example, writing a memory cell may include bringing the memory cell into the first memory state or into the second memory state. As an example, the first memory state may be associated with a logic "1" and the second state may be associated with a logic "0". However, the definition of first memory state and second memory state may be selected arbitrarily. For example, writing a remanent-polarizable memory cell may modify the polarization state of the remanent-polarizable memory cell from the first polarization state to the second polarization state (e.g., opposite to the first polarization state), or vice versa.

According to various aspects, a memory cell may include a transistor structure that is coupled to or includes a ferroelectric material as a remanent polarizable portion (e.g., a ferroelectric field-effect transistor, "FeFET"). The term "ferroelectric" may be used herein, for example, to describe a material that shows a hysteretic charge voltage relationship (Q-V). The ferroelectric material may be or may include ferroelectric $HfO_2$. Ferroelectric $HfO_2$ may include any form of hafnium oxide that may exhibit ferroelectric properties. This may include, for example, $HfO_2$, $ZrO_2$, or a solid solution of $HfO_2$ and $ZrO_2$ (e.g., but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. According to various aspects, a ferroelectric material may be an example of a material used in a remanent-polarizable portion. According to various aspects, a ferroelectric portion may be an example of a remanent-polarizable portion.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on a memory cell arrangement as described below. The memory cell arrangement may include ferroelectric memory cells. Since a ferroelectric material included in a ferroelectric memory cell may have at least two stable polarization states, the ferroelectric transistor may be used as a non-volatile memory cell. Thus, a ferroelectric memory cell may store data by means of a ferroelectric material between at least a first electrode and a second electrode of a gate structure or a capacitor structure. According to various aspects, a non-volatile field-effect transistor based memory structure, memory element, or memory cell may store data for a period of time from hours (e.g., more than 5 hours) to several tens of years (e.g., 10 years, 20 years, etc.), whereas a volatile memory cell may store data for a period of time from nanoseconds to hours (e.g., less than 5 hours).

In comparison to other emerging memory technologies, a ferroelectric memory cell may be integrated in the Front-End-of-Line (FEoL) and/or in the Back-End-of-Line (BEoL) process flow, since it may be implemented as a transistor-type of memory. Accordingly, the integration of the ferroelectric memory cell may comply with a standard FEoL and/or BEoL complementary metal-oxide-semiconductor (CMOS) process flow. Consequently, various different integration schemes may be used to integrate a ferroelectric memory cell in different process technologies, e.g., gate-first technologies, gate-last technologies, fully-depleted silicon-on-insulator (FDSOI) technologies, Fin-FET technologies, nanosheet technologies, nanowire technologies, as examples.

A ferroelectric memory cell may include a ferroelectric field-effect transistor (e.g., a field-effect transistor structure having a ferroelectric gate isolation, in some aspects referred to as "FeFET") or a field-effect transistor having a ferroelectric memory structure (e.g., a ferroelectric capacitor, in some aspects referred to as "FeCAP") coupled to a gate of the field-effect transistor.

In some aspects, a memory cell arrangement (e.g., an array including a plurality of memory cells) may be operated based on one or more write operations and/or one or more readout operations. During a write operation, as example, predefined voltages may be provided to electrical lines (also referred to as control lines or driver-lines), wherein the electrical lines may be connected to the respective nodes (e.g., respective electrodes) of the memory cells to allow for the desired operation. The electrical lines may be referred to, for example, as bitlines, wordlines, drainlines, and/or sourcelines. All memory cells that are not intended to be written may see a voltage that is at least less than the programming voltage. The programming voltage may be defined by the type and/or design of memory cell. The programming voltage may be determined via one or more electrical measurements. Various timings may be used to provide the respective voltages, e.g., to provide the desired write voltages and/or the desired readout voltages.

In general, a memory cell arrangement may include a plurality of (e.g., volatile or non-volatile) memory cells, which may be accessed individually or on groups via a corresponding addressing scheme. The matrix architecture may be, for example, referred to as "OR", "AND", "NOR", or "NAND" architecture, depending on the way neighboring memory cells are connected to each other, i.e., depending on the way the terminals of neighboring memory cells are shared, but are not limited to these types. For example, in a NAND architecture the memory cells may be organized in sectors (also referred to as blocks) of memory cells, wherein the memory cells are serially connected in a string (e.g., source and drain regions are shared by neighboring transistors), and the string is connected to a first control line and a second control line. For example, groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells. A memory cell (e.g., a single memory cell of the memory cell arrangement) may be written from one of at least two memory states into another one of the at least two memory states of the memory cell.

In general, memory cells may be read out depending on the type of memory cell using a flowing current. The current may be flowing through the memory cell, may be provided by the memory cell, may be a charging current flowing to the memory cell, etc. The current may be detected using a current sense amplifier that outputs a voltage proportional to the current. However, it may be difficult to determine a memory state of the memory cell based on the current.

Various aspects are related to an efficient read-out of a memory cell. In some aspects, a memory state of a memory cell may be determined based on charging or discharging a bitline connected to the memory cell to a characteristic voltage representing the memory state of the memory cell. The memory cell may be configured to self-regulate the charging or discharging of the bitline. For example, the memory cell may be configured to charge or discharge the bitline to a substantially stable voltage. This substantially stable voltage may be characteristic for the memory state of the memory cell. Illustratively, the bitline may be charged or discharged in a self-regulated manner via the memory cell as a function of the memory state of the memory cell. Hence, once the voltage that characterizes the memory state is reached, self-regulated by the memory cell, the voltage is substantially stable during the read-operation. According to various aspects, the voltage itself may characterize the memory state. This may allow for an efficient (e.g., reliable, e.g., independent of electric current properties of the FET of the memory cell, e.g., with a lean read-out circuit) read-out of the memory cell, since, for example, no current flow through the memory cell has to be measured; instead, the characteristic voltage itself may be indicative of the memory state of the memory cell.

FIGS. 1A to 1E illustrates schematically an exemplary memory cell arrangement 100, according to various aspects.

With respect to FIG. 1A, the memory cell arrangement 100 may include at least one memory cell 102. The memory cell 102 may be configured as a non-volatile memory cell. The memory cell 102 may have at least three terminals, including, for example, a first terminal, a second terminal, and a third terminal. The memory cell 102 may include a memory element. The memory cell 102 may be configured to allow for a control of a current flow between the first terminal and the second terminal (e.g., from the first terminal to the second terminal, e.g., from the second terminal to the first terminal) as a function of a first voltage present at the first terminal, a third voltage applied at the third terminal, and a memory state of the memory cell 102 (e.g., a state of the memory element).

In the following, the memory cell 102 is described exemplarily as including a source terminal 104 as the first terminal, a drain terminal 106 as the second terminal, and a control terminal 108 as the third terminal. According to various aspects, the first terminal may be the source terminal 104, the second terminal may be the drain terminal 106, and the third terminal may be the control terminal 108 (see, for example, FIG. 4B, FIG. 4D). However, it is noted that depending on the configuration of the memory cell 102 the first terminal, the second terminal, and/or the third terminal may be any other kind of terminal as long as the memory cell 102 is capable to control a current flow between the first terminal and the second terminal as a function of a first voltage present at the first terminal, a third voltage applied at the third terminal, and a memory state of the memory cell 102.

The memory cell 102 may be writable into at least two memory states including a first memory state and a second memory state. The first memory state may be a low threshold voltage state (referred to as LVT state) and may have a first voltage (referred to as "low threshold" voltage), $V_{L-th}$, associated therewith. The second memory state may be a high threshold voltage state (referred to as HVT state) and may have a second voltage (referred to as "high threshold" voltage), $V_{H-th}$, that may be different from the low threshold voltage, $V_{L-th}$, associated with the LVT state (e.g., different absolute value and/or different signs as described above). The respective threshold voltage ($V_{L-th}$ or $V_{H-th}$) may define a control-source voltage, $V_{CS}$, (a voltage drop between the control terminal of the memory cell 102 and the source terminal 104 of the memory cell 102) at which an electric current (e.g., a technical current flow) may flow from the source terminal to the drain terminal. The memory cell 102 may electrically conductively connect the source terminal 104 with the drain terminal 106 in the case that a control-source voltage, $V_{CS}$, present between the source terminal 104 and the control terminal 108 is equal to or higher than the respective threshold voltage. The respective threshold voltage is a function of the memory state the memory cell 102 may reside in. For example, in the case that the memory cell 102 is in the first memory state (e.g., the LVT state), the memory cell 102 may electrically conductively connect the source terminal 104 with the drain terminal 106 in the case that a control-source voltage, $V_{CS}$, present between the source terminal 104 and the control terminal 108 is equal to or higher than the first threshold voltage. As another example, in the case that the memory cell 102 is in the second memory state (e.g., the HVT state), the memory cell 102 may electrically conductively connect the source terminal 104 with the drain terminal 106 in the case that a control-source voltage, $V_{CS}$, present between the source terminal 104 and the control terminal 108 is equal to or higher than the second threshold voltage.

According to various aspects, the memory cell arrangement 100 may include a read-out circuit 110. The read-out circuit 110 may be any type of circuit and may include any kind of elements such that the read-out circuit is capable to perform at least the read-out operation as described herein. The memory cell arrangement 100 may include one or more control lines. The control line may be connected to the source terminal 104 of the memory cell 102. According to various aspects, the control line may be a bitline 112. According to various aspects, the read-out circuit 110 may be configured to apply a select voltage, $V_{sel}$, at the control terminal 108 of the memory cell 102. The read-out circuit 110 may be configured to apply a drain voltage, $V_D$, at the drain terminal 106 of the memory cell 102. The read-out circuit 110 and the memory cell 102 may be configured to generate a characteristic voltage, $V_{char}$, at the bitline 112 by applying the select voltage, $V_{sel}$, at the control terminal 108 of the memory cell 102 and the drain voltage, $V_D$, at the drain terminal 106 of the memory cell 102. The characteristic voltage, $V_{char}$, may represent the actual memory state of the memory cell 102 (e.g., a state of the memory element). According to various aspects, the read-out circuit 110 may be configured to apply the select voltage, $V_{sel}$, at the control terminal 108 of the memory cell 102 and/or the drain voltage, $V_D$, at the drain terminal 106 of the memory cell 102 such that the memory state of the memory cell does not change (illustratively, such that the memory cell 102 is not written).

According to various aspects, the read-out circuit 110 may be configured to apply the select voltage, $V_{sel}$, at the control terminal 108 of the memory cell 102 and the drain voltage, $V_D$, at the drain terminal 106 of the memory cell 102 to charge and/or discharge (in some aspects referred to as charge/discharge) the bitline 112. For example, the read-out circuit 110 may be configured to generate the characteristic voltage, $V_{char}$, at the bitline 112 by applying the select voltage, $V_{sel}$, at the control terminal 108 of the memory cell 102 and the drain voltage, $V_D$, at the drain terminal 106 of the memory cell 102 to charge/discharge the bitline 112 to the characteristic voltage, $V_{char}$. The read-out circuit 110 may be configured to charge/discharge the bitline 112 to the characteristic voltage by charging and/or discharging the bitline 112 to the characteristic voltage through (e.g., via) the memory cell 102. Illustratively, the bitline 112 may be dynamically charged through the memory cell 102 until the memory cell 102 stops being in a conductive state based on its transfer characteristics. For example, the memory cell 102 may be in a conductive state in the case that the control-source voltage, $V_{CS}$, present between the source terminal 104 and the control terminal 108 is equal to or greater than the respective threshold voltage associated with the memory state of the memory cell 102 (e.g., $V_{L-th}$ in the case of the LVT state, e.g., $V_{H-th}$ in case of the HVT state). According to various aspects, the memory cell 102 may be configured to stop dynamically charging the bitline 102 in the case that the control-source voltage, $V_{CS}$, is lower than the respective threshold voltage associated with the memory state of the memory cell 102 The read-out circuit 110 may be further configured to allow a determination of the memory state of the memory cell 102 based on sensing the characteristic voltage, $V_{char}$.

According to various aspects, the read-out circuit 110 may be configured to perform a read-out operation. The read-out operation may include generating the characteristic voltage, $V_{char}$, at the bitline 112 by applying the select voltage, $V_{sel}$, at the control terminal 108 of the memory cell 102 and the drain voltage, $V_D$, at the drain terminal 106 of the memory cell 102 (e.g., to charge/discharge the bitline 112 to the characteristic voltage, $V_{char}$). The read-out operation may further include sensing the characteristic voltage, $V_{char}$, to determine the memory state of the memory cell 102. For example, the read-out operation may include determining the memory state of the memory cell 102 based on sensing the characteristic voltage, $V_{char}$.

In the following the memory cell 102 is described as being writable into a first memory state that may have a first characteristic voltage associated therewith and a second memory state that may have a second characteristic voltage associated therewith (see, for example, FIG. 6B and FIG. 6D). The first characteristic voltage may be different from the second characteristic voltage. However, it is noted that a memory cell 102 may include more than two memory states, wherein each memory state may be associated with a respective characteristic voltage different from the other characteristic voltages.

According to various aspects, the read-out circuit 110 may be configured to charge the bitline 112 (e.g., the bitline 112 and the source terminal 104) through the memory cell 102. At the beginning or before the bitline 112 is charged, the bitline 112 may be at a first voltage (e.g., a base voltage, $V_B$, of the memory cell arrangement 100, e.g., a first reference voltage) and during or after charging, the bitline may be at a characteristic voltage, $V_{char}$. The voltage value of the characteristic voltage, $V_{char}$, may be more positive as compared to the absolute voltage value of the first voltage. As described above, the memory cell 102 may have a low threshold voltage, $V_{L-th}$, for the first memory state and a high threshold voltage, $V_{H-th}$, for the second memory state. As described above, the memory cell 102 may include a field-effect transistor (e.g., a FeFET or a FeCAP coupled to a gate of a FET). The respective FET may be an enhancement-type FET or a depletion-type FET. Thus, depending on the memory state the memory cell 102 is residing in, the memory cell 102 may charge the bitline 112 to a first characteristic voltage, $V_{char1}$, for the first memory state (e.g., the LVT state) and to a second characteristic voltage, $V_{char2}$, for the second memory state (e.g., the HVT state). The voltage value of the first characteristic voltage, $V_{char1}$, may different from (e.g., higher than) the voltage value of the second characteristic voltage, $V_{char2}$. Exemplary configurations of the memory cell 102 are explained in more detail below with reference to FIGS. 4A to 4I.

According to various aspects, the read-out circuit 110 may be configured to discharge the bitline 112 (e.g., the bitline 112 and the source terminal 104) through the memory cell 102 from a first voltage (e.g., a first reference voltage) to a characteristic voltage, $V_{char}$. The characteristic voltage value, $V_{char}$, may be more negative than the first voltage. Depending on the memory state the memory cell 102 is residing in, the transistor of the memory cell 102 may discharge the bitline 112 to the first characteristic voltage, $V_{char1}$, for the first memory state (e.g., the LVT state) and to the second characteristic voltage, $V_{char2}$, for the second memory state (e.g., the HVT state). The voltage value of the first characteristic voltage, $V_{char1}$, may be different from (e.g., lower than) the voltage value of the second characteristic voltage, $V_{char2}$.

The read-out circuit 110 may be configured to determine whether the first characteristic voltage, $V_{char1}$, or the second characteristic voltage, $V_{char2}$, is generated at the bitline 112. For example, the read-out circuit 110 may be configured to compare the characteristic voltage, $V_{char}$, generated at the bitline 112 to at least one reference voltage to determine whether the first characteristic voltage, $V_{char1}$, or the second characteristic voltage, $V_{char2}$, is generated at the bitline 112.

Figure 1B:
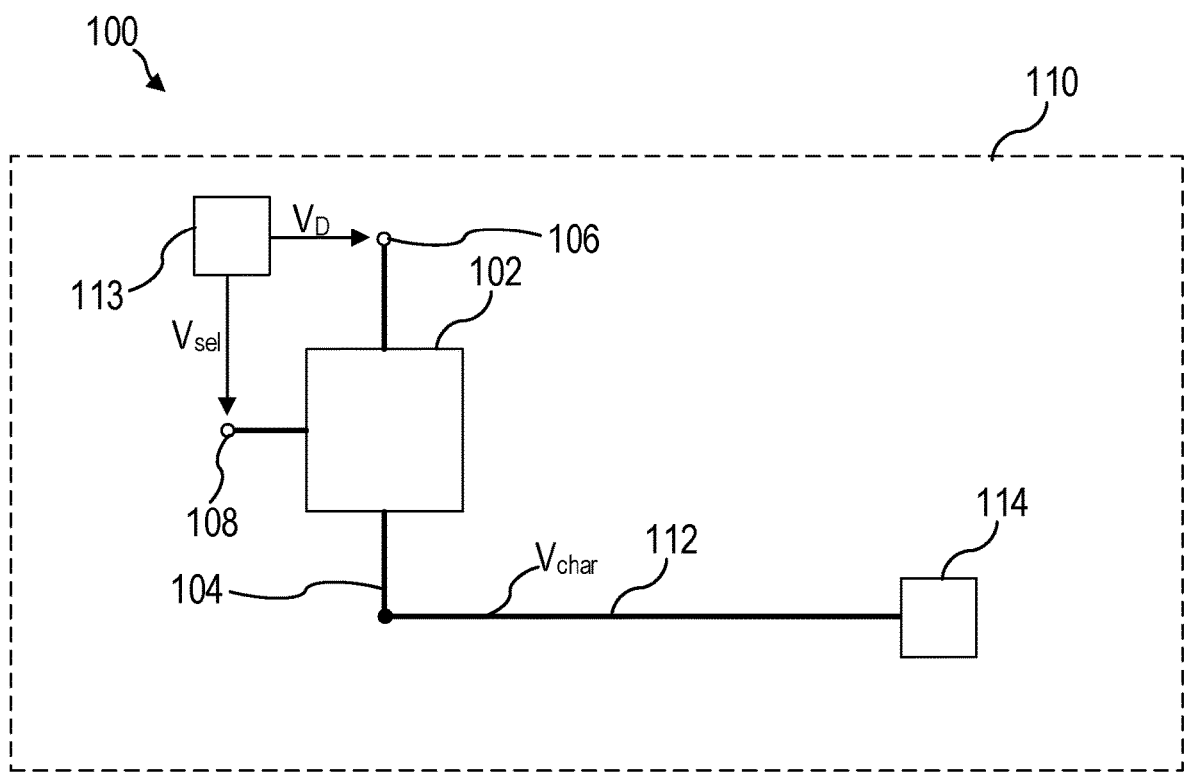
Figure 1C:
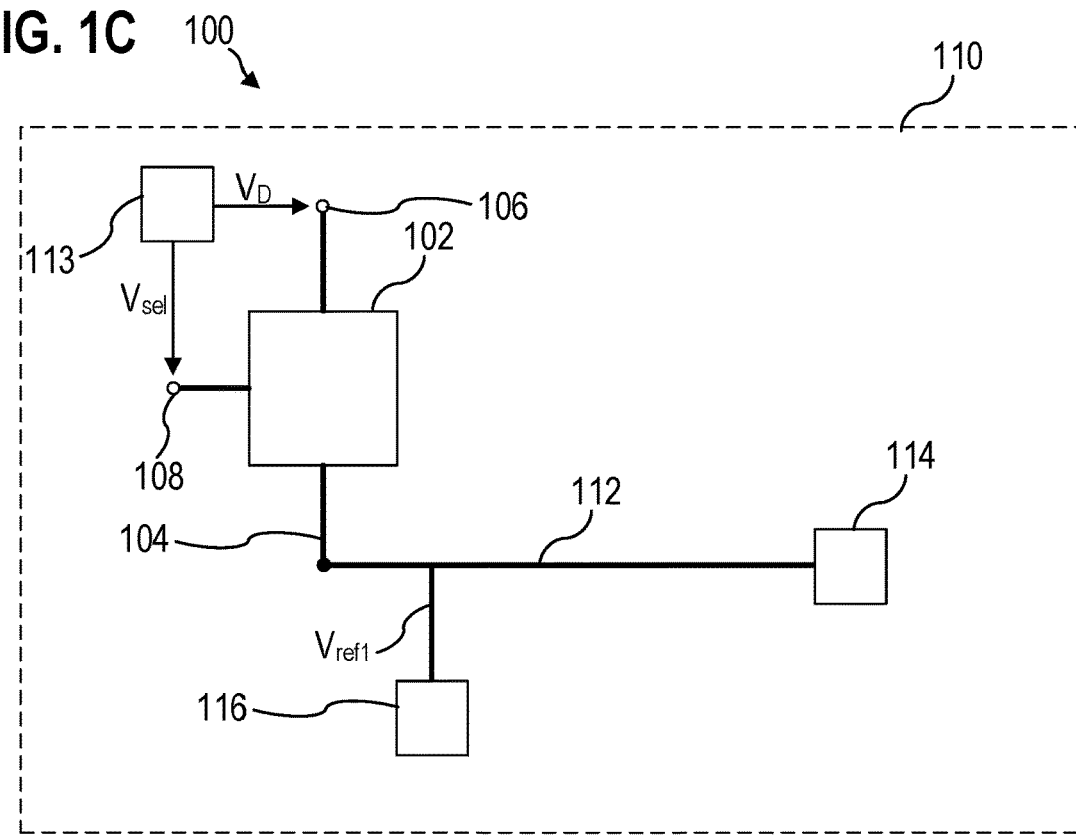

With respect to FIG. 1B, the read-out circuit 110 may include a voltage-supply circuit 113. The read-out circuit 110 may include a sensing circuit 114. The voltage-supply circuit 113 may be configured to provide at least some functions of the read-out circuit 110. For example, the voltage-supply circuit 113 may be configured to apply the select voltage, $V_{sel}$, at the control terminal 108 of the memory cell 102. For example, the voltage-supply circuit 113 may be configured to apply the drain voltage, $V_D$, at drain terminal 106 of the memory cell 102. The sensing circuit 114 may be configured to provide at least some functions of the read-out circuit 110. For example, the sensing circuit 114 may be configured to sense the characteristic voltage, $V_{char}$, generated at the bitline 112. For example, the sensing circuit 114 may be configured to determine the memory state of the memory cell 102 by sensing the characteristic voltage, $V_{char}$.

According to various aspects, the sensing circuit 114 may be capable to determine whether the first characteristic voltage, $V_{char1}$, or the second characteristic voltage, $V_{char2}$, is generated at the bitline 112. The sensing circuit 114 may include at least one voltage comparator (e.g., a latch).

According to various aspects, the read-out circuit 110 may be configured to carry out a reset operation. For example, the read-out circuit 110 may be configured to carry out a reset operation to reset a voltage of the bitline 112 to a predefined voltage (e.g., a first reference voltage). According to other aspects, a reset circuit may be configured to perform the reset operation described below in connection with the read-out circuit 110. With respect to FIG. 1C, the reset operation may include charging/discharging the bitline 112 to a first reference voltage, $V_{ref1}$, (e.g., a first reference potential).

According to various aspects, the read-out circuit 110 may include a voltage source/sink 116 to charge/discharge the bitline 112 to the first reference voltage, $V_{ref1}$. For example, the voltage source/sink 116 may be a voltage source to charge the bitline 112 to the first reference voltage, $V_{ref1}$, and/or the voltage source/sink 116 may be a voltage sink to discharge the bitline 112 to the first reference voltage, $V_{ref1}$.

Figure 1D:
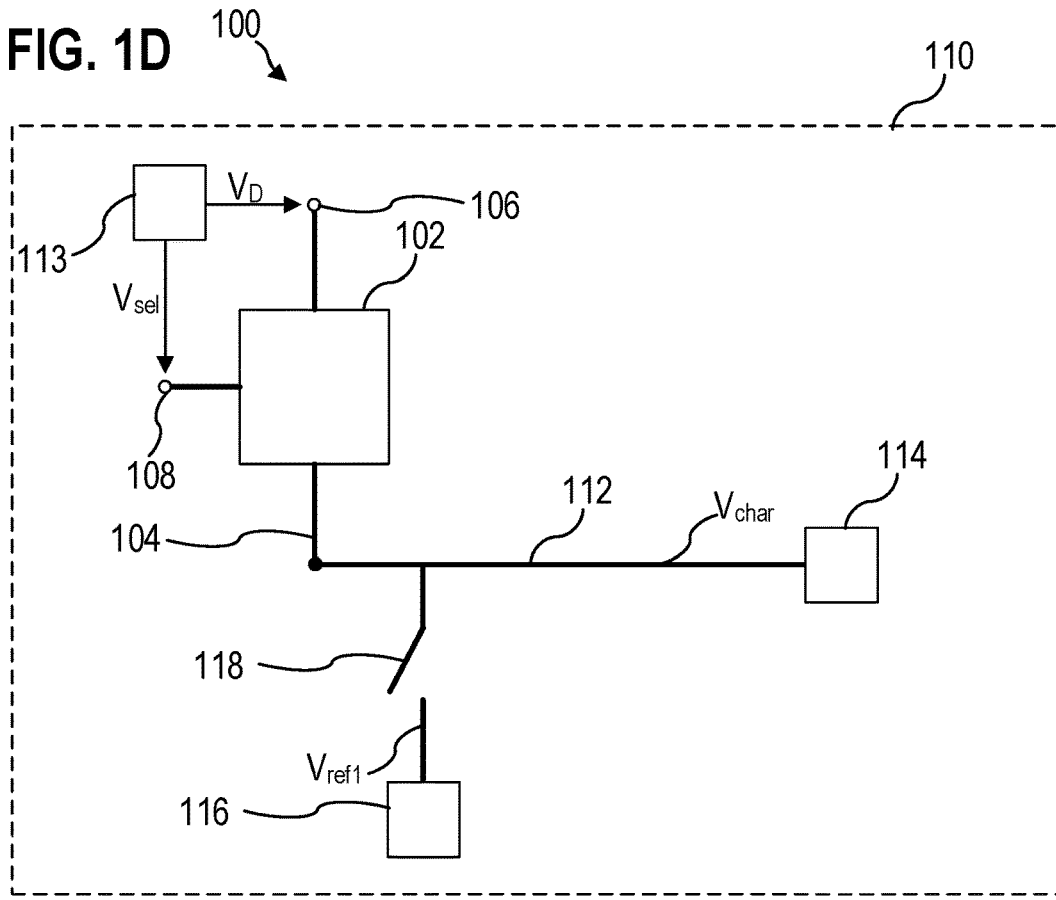

As shown in FIG. 1D, the read-out circuit 110 may include a switch 118. The switch 118 may be an electronic switch, such as bidirectional electronic switch. The switch 118 may include a thyristor, a triac, and/or a transistor (e.g., a metal-oxide-semiconductor field effect transistor, e.g., an insulated-gate bipolar transistor (IGBT), etc.). The switch 118 may be configured to selectively connect or disconnect the bitline 112 to the voltage source/sink 116 to charge/discharge the bitline 112 to the first reference voltage, $V_{ref1}$.

According to various aspects, the read-out circuit 110 may be configured to carry out the reset operation prior to the read-out operation. According to various aspects, the read-out circuit 110 may be configured to carry out the reset operation subsequent to the read-out operation. The read-out circuit 110 may be configured to carry out a first read-out operation at a first time and a second read-out operation at a second time different from the first time. The read-out circuit 110 may be configured to carry out the reset operation at a third time between the first time and the second time. For example, the read-out circuit 110 may be configured to carry out the reset operation between two consecutive read-out operations.

For example, the read-out circuit 110 may be configured to carry out the reset operation including discharging the bitline 112 to the first reference voltage, $V_{ref1}$, using the voltage source/sink 116 and may be further configured to carry out the read-out operation including charging the bitline 112 to the characteristic voltage, $V_{char}$, and sensing the characteristic voltage, $V_{char}$, to determine the memory state of the memory cell 102. For example, the read-out circuit 110 may be configured to carry out the reset operation including charging the bitline 112 to the first reference voltage, $V_{ref1}$, using the voltage source/sink 116 and may be further configured to carry out the read-out operation including discharging the bitline 112 to the characteristic voltage, $V_{char}$, and sensing the characteristic voltage, $V_{char}$, to determine the memory state of the memory cell 102.

Figure 1E:
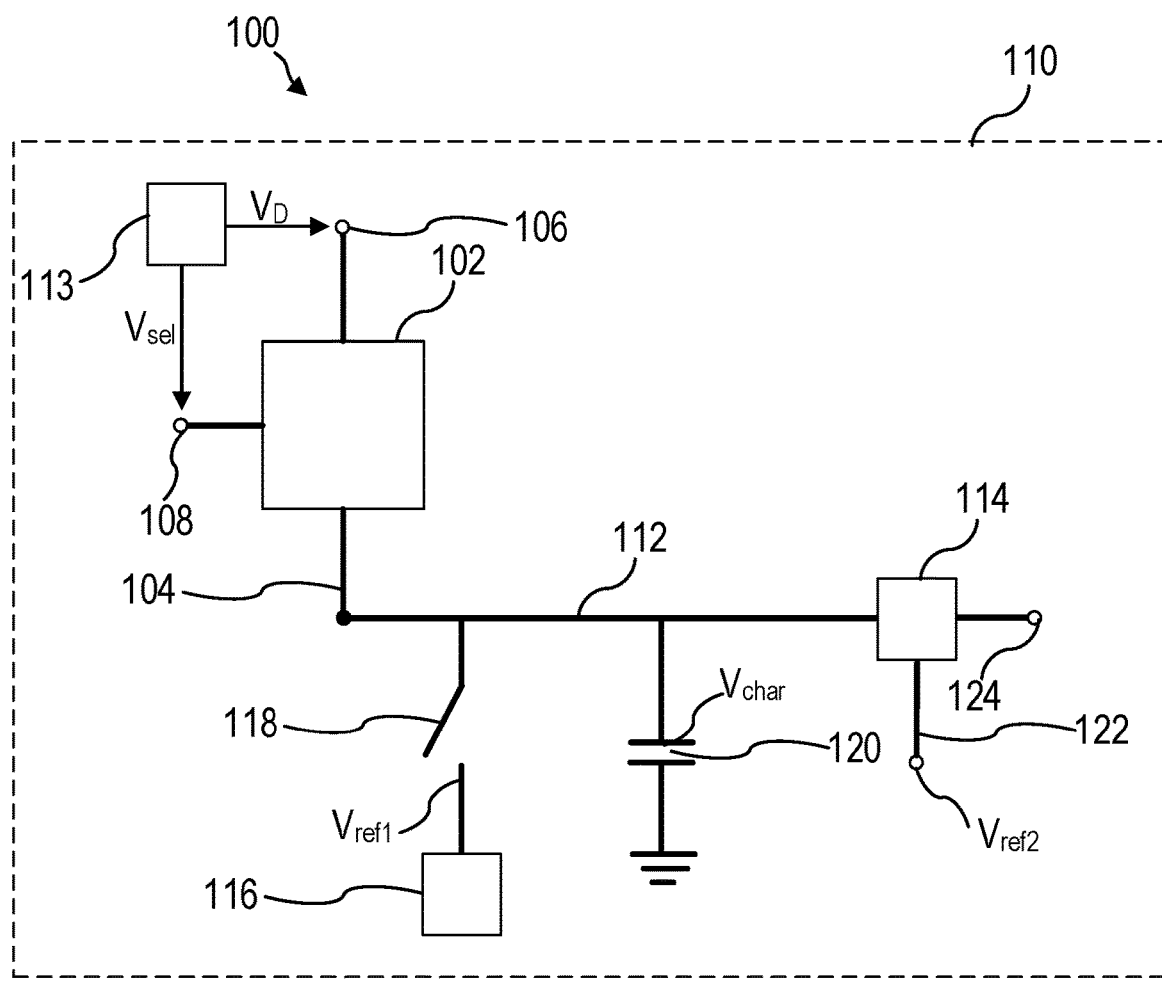

FIG. 1E illustrates schematically an exemplary memory cell arrangement 100, according to various aspects. The equivalent circuit in FIG. 1E shows a capacitor 120 that may indicate the inherent capacitance of the bitline 112 (e.g., for charging or discharging the bitline 112). In other words, the memory cell arrangement 100 may not include a dedicated capacitor structure and may instead make use of the inherent capacitance of the bitline 112. However, the memory cell arrangement 100 may include a dedicated capacitor connected to the bitline 112 if this is desired.

The sensing circuit 114 may be configured to determine the memory state of the memory cell 102 based on the characteristic voltage, $V_{char}$. The sensing circuit 114 may be configured to determine the memory state of the memory cell 102 by comparing the characteristic voltage, $V_{char}$, generated at the bitline 112 to a second reference voltage, $V_{ref2}$, (e.g., supplied to a reference input terminal 122 of the sensing circuit 114). According to various aspects, the sensing circuit 114 may include a voltage comparator (e.g., a latch) to compare the characteristic voltage, $V_{char}$, generated at the bitline 112 to the second reference voltage, $V_{ref2}$, (in some aspects referred to as comparator reference voltage, $V_{ref2}$). The second reference voltage, $V_{ref2}$, may include a constant voltage value or may include a voltage value associated with another control line. For example, the second reference voltage, $V_{ref2}$, may include a voltage value associated with another bitline.

The sensing circuit 114 may be configured to provide a result of the comparison, for example, at an output terminal 124. According to various aspects, the sensing circuit 114 may provide a logic "1" for the first memory state (e.g., the LVT state) and a logic "0" for the second memory state (e.g., the HVT state) at the output terminal 124, or vice versa. One or more aspects of a possibility to provide a result of the comparison are described in more detail below, for example, with reference to FIGS. 3A to 3C.

The memory cell arrangement 100 may include a plurality of memory cell 102. Each memory cell 102 of the plurality of memory cell 102 may include a source terminal 104, a drain terminal 106, and a control terminal 108. According to various aspects, the source terminal 104 of one or more memory cell 102 of the plurality of memory cell 102 may be connected to a common control line, such as the bitline 112.

The read-out circuit 110 may be configured to read out the memory state of one or more of the plurality of memory cell 102.

Figure 2:
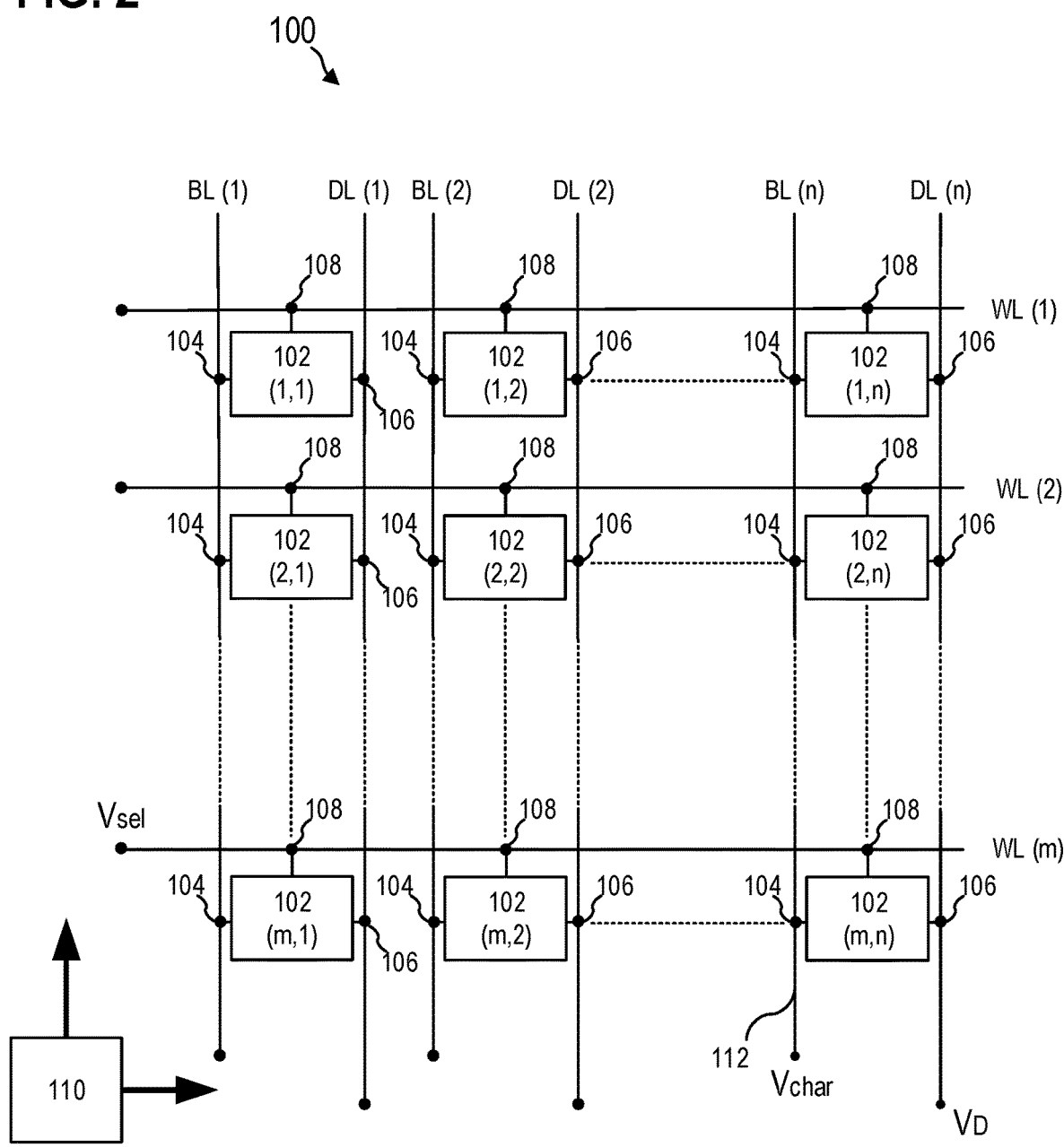
FIG. 2 schematically shows an exemplary memory cell arrangement, according to various aspects.

FIG. 2 schematically illustrates an exemplary memory cell arrangement 100, according to various aspects. The memory cell arrangement 100 may include a plurality, n, of first control lines, for example, a plurality of bitlines BL(n). The memory cell arrangement 100 may include a plurality, n, of second control lines, for example, a plurality of drainlines (DL(n) (e.g., sourcelines). The memory cell arrangement 100 may include a plurality, m, of third control lines, for example, a plurality of wordlines WL(m). The memory cell arrangement 100 may include a plurality of memory cell 102. For each memory cell 102(m, n) of the plurality of memory cell 102, the source terminal 104 may be connected to a corresponding bitline BL(n), the drain terminal 106 may be connected to a corresponding drainline DL(n), and the control terminal 108 may be connected to a corresponding wordline WL(m).

The readout-out circuit 110 may be configured to read out the memory state of at least one memory cell 102(m, n) of the plurality of memory cell 102 (e.g., by carrying out the read-out operation). For example, the readout-out circuit 110 may be configured to carry out the read-out operation including the following: providing a select voltage, $V_{sel}$, at the wordline WL(m) corresponding to the memory cell 102(m, n) and a drain voltage, $V_D$, at the corresponding drainline DL(n) to charge or discharge the corresponding bitline BL(n) (e.g., configured as bitline 112) to a characteristic voltage, $V_{char}$, and sensing the characteristic voltage, $V_{char}$, to determine the memory state of the memory cell 102(m, n).

Figure 3A:
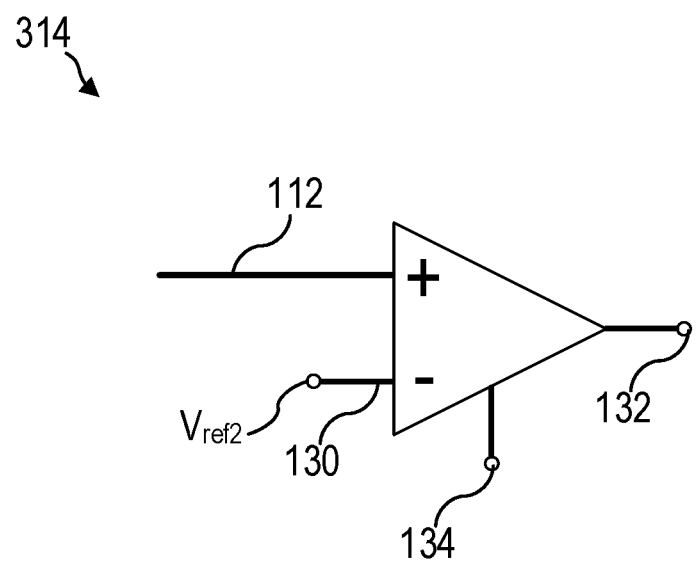
FIGS. 3A to 3C schematically show a latch-based voltage comparator, according to various aspects.
Figure 3B:
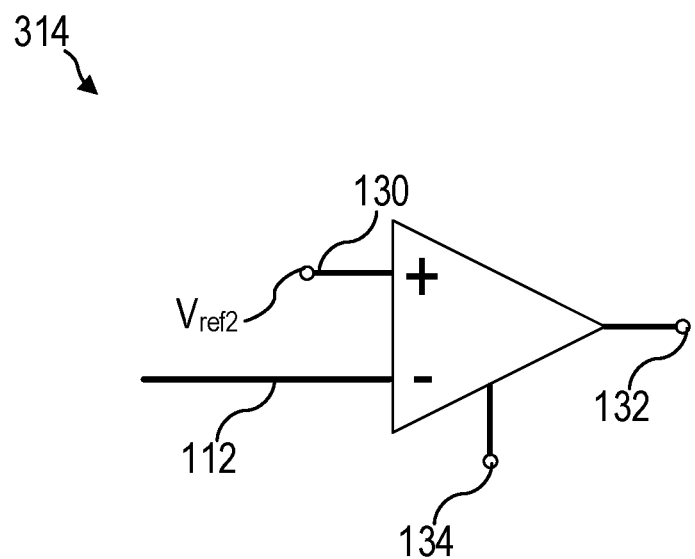

FIGS. 3A and 3B each illustrate schematically an exemplary latch-based voltage comparator 314, according to various aspects. The sensing circuit 114 may include one or more voltage comparator 314 to sense the characteristic voltage, $V_{char}$.

The voltage comparator 314 may include a first input terminal connected to the control line 122 and a second input terminal 130 connected to the second reference voltage, $V_{ref2}$. The voltage comparator 314 may include an output terminal 132, such as the output terminal 124, to provide a logic "1" or logic "0" depending on the memory state of the memory cell 102. For example, the voltage comparator 314 may be configured to provide a logic "1" at the output terminal 132 in the case that a characteristic voltage, $V_{char}$, is more positive than the second reference voltage, $V_{ref2}$, (as shown in FIG. 3A). For example, the voltage comparator 314 may be configured to provide a logic "1" at the output terminal 132 in the case that a characteristic voltage, $V_{char}$, is more negative than the second reference voltage, $V_{ref2}$, (as shown in FIG. 3B).

The voltage comparator 314 may be a latch. The voltage comparator 314 may include an enable terminal 134. The voltage comparator 314 may be configured to perform or to be in a first mode or a second mode depending on a voltage applied at the enable terminal 134. For example, the voltage comparator 314 may be configured to compare the characteristic voltage, $V_{char}$, generated at the bitline 112 to the second reference voltage, $V_{ref2}$, in the first mode (e.g., a track mode, e.g., the voltage comparator 314 is "ON") and may be configured to not compare the characteristic voltage, $V_{char}$, present at the bitline 112 to the second reference voltage, $V_{ref2}$, in the second mode (e.g., a hold mode, e.g., the voltage comparator 314 is "OFF"). For example, the voltage comparator 314 may be configured to provide an output including a logic "1" or a logic "0" at the output terminal 132 in the first mode (e.g., the voltage comparator 314 is "ON") and may be configured to provide no output at the output terminal 132 in the second mode (e.g., the voltage comparator 314 is "OFF").

Figure 3C:
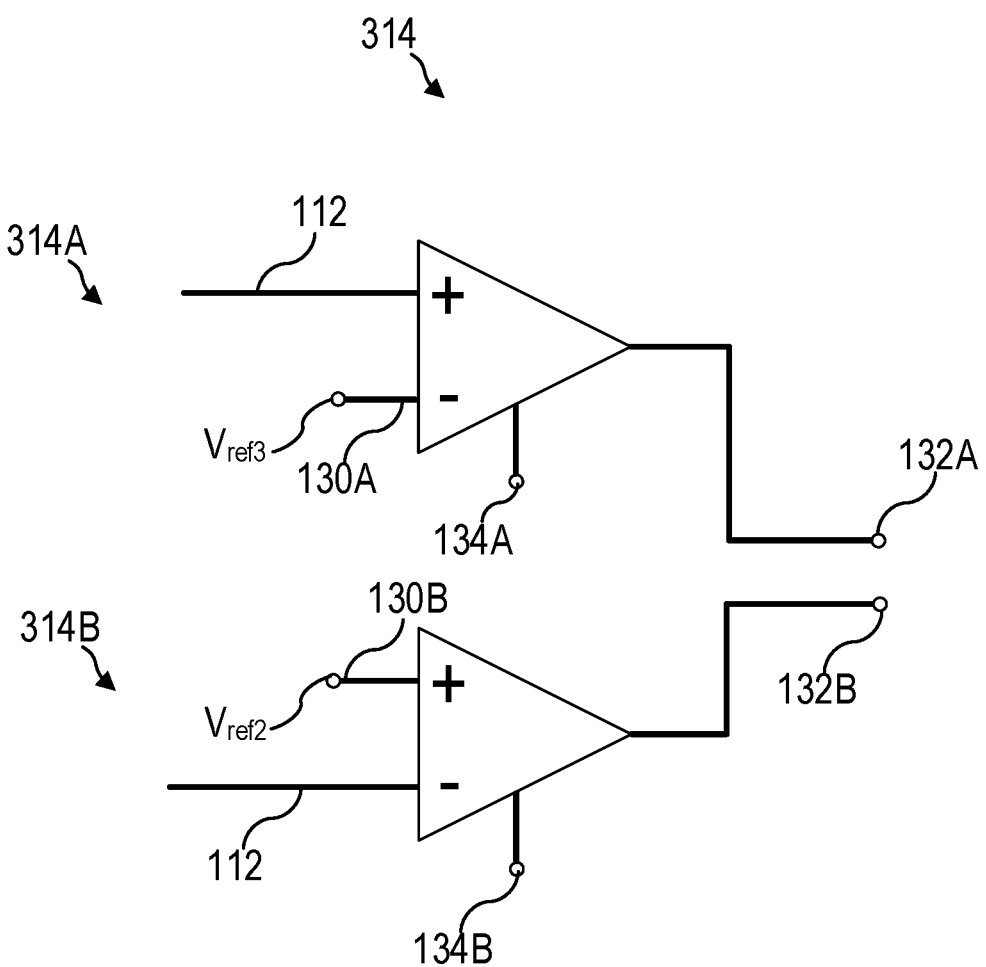

FIG. 3C illustrates schematically an exemplary latch-based voltage comparator 314, according to various aspects, wherein the at least one voltage comparator 314 includes a first voltage comparator 314A and a second voltage comparator 314B.

According to various aspects, the at least one voltage comparator 314 may be configured to determine the memory state of the memory cell 102 by comparing the characteristic voltage, $V_{char}$, to the second reference voltage, $V_{ref2}$, and to a third reference voltage, $V_{ref3}$. The third reference voltage may be different from the second reference voltage. For example, the first voltage comparator 314A may be configured to compare the characteristic voltage, $V_{char}$, generated at the bitline 112 to the third reference voltage, $V_{ref3}$, and the second voltage comparator 314B may be configured to compare the characteristic voltage, $V_{char}$, generated at the bitline 112 to the second reference voltage, $V_{ref2}$, or vice versa. For example, the third reference voltage value may be more negative than the second reference voltage value and the read-out circuit 110 including the first voltage comparator 314A and the second voltage comparator 314B may be configured to determine one of three outputs: whether the characteristic voltage, $V_{char}$, generated at the bitline 112 has a voltage value more negative than the third reference voltage value, $V_{ref3}$, whether the characteristic voltage, $V_{char}$, generated at the bitline 112 has a voltage value in a range between the third reference voltage, $V_{ref3}$, and the second reference voltage value, $V_{ref2}$, or whether the characteristic voltage, $V_{char}$, generated at the bitline 112 has a voltage value more positive than the second reference voltage, $V_{ref2}$. For example, the third reference voltage value may be more positive than the second reference voltage and the read-out circuit 110 including the first voltage comparator 314A and the second voltage comparator 314B may be configured to determine one of three outputs: whether the characteristic voltage, $V_{char}$, generated at the bitline 112 has a voltage value more positive than the third reference voltage value, $V_{ref3}$, whether the characteristic voltage, $V_{char}$, generated at the bitline 112 has a voltage value in a range between the third reference voltage, $V_{ref3}$, and the second reference voltage value, $V_{ref2}$, or whether the characteristic voltage, $V_{char}$, generated at the bitline 112 has a voltage value more negative than the second reference voltage, $V_{ref2}$. According to various aspects, a first output of the three outputs may be associated a logic "1", a second output of the three outputs may be associated a logic "0", and/or a third output of the three outputs may be associated a read-out error.

FIGS. 4A to 4I show exemplary configurations of a memory cell 102 in accordance with various aspects. The memory cell 102 may include a field-effect transistor structure 400 (e.g., a field-effect transistor structure 400-1 and/or a field-effect transistor structure. 400-2).

Figure 4A:
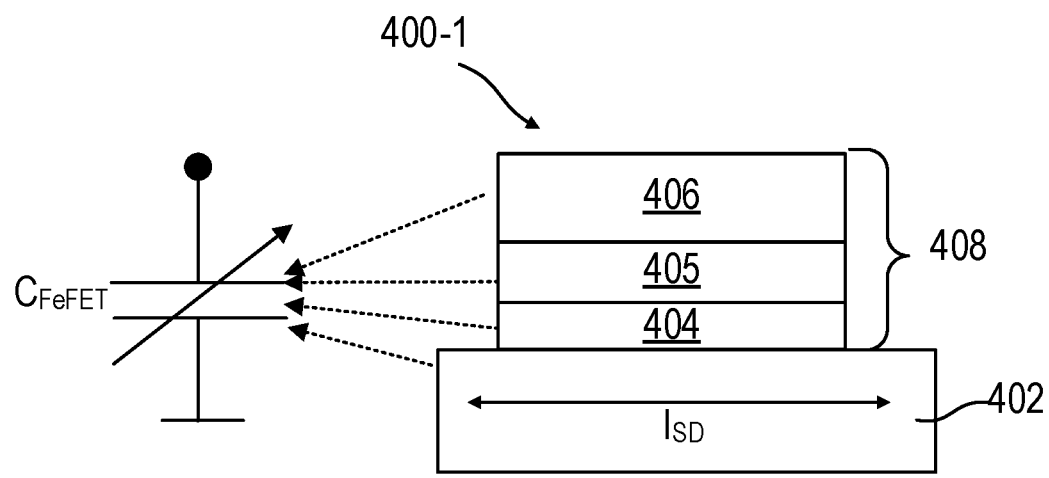
FIGS. 4A to 4I schematically show exemplary configurations of a memory cell, according to various aspects.
Figure 4B:
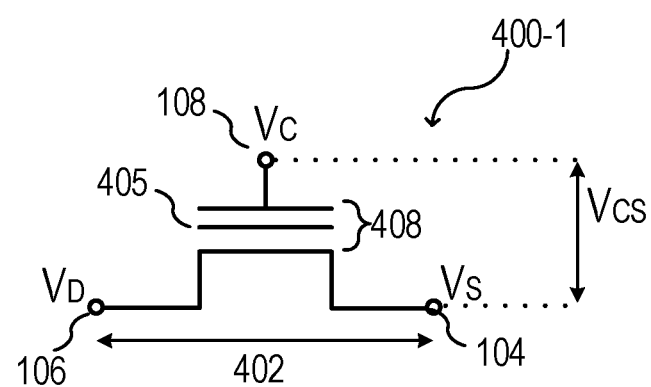

A memory cell 102 may be provided, for example, by integrating a memory structure in the gate structure of a field-effect transistor structure (see, for example, field-effect transistor structure 400-1 shown FIG. 4A and FIG. 4B), or by coupling a gate of a field-effect transistor structure with a capacitive memory structure (see, for example, field-effect transistor structure 400-1 shown FIG. 4C to FIG. 4I). Various embodiments may therefore provide a field-effect transistor structure adapted to memory-cell applications.

According to various aspects, a field-effect transistor structure is described that is specifically adapted for memory-related applications, e.g. a field-effect transistor structure adapted for use in a (capacitor-based) memory cell (e.g., as illustrated in FIGS. 4C to 4G).

FIG. 4A shows a schematic functioning of a field-effect transistor structure 400-1, according to various aspects, and FIG. 4B shows an equivalent circuit in accordance therewith. The field-effect transistor structure 400-1 may be configured as a ferroelectric field-effect transistor. The field-effect transistor structure 400-1 may include a gate structure 408, wherein the gate structure 408 may include a memory element 405, and a gate electrode 406. According to various aspects, the gate structure 408 may further include a gate isolation 404, wherein the memory element 405 may be disposed between the gate isolation 404 and the gate electrode 406. According to various aspects, the memory element 405 may be a remanent-polarizable layer (e.g. a ferroelectric layer). The gate structure 408 is illustrated exemplarily as a planar gate stack, however, it may be understood that the planar configuration shown in FIG. 4A is an example, and other field-effect transistor designs may include a gate structure 408 with a non-planar shape, for example a trench gate transistor design, a vertical field-effect transistor design, or other designs as exemplarily shown in FIG. 4H and FIG. 4I, as examples. The gate structure 408 may define a channel region 402, e.g., provided in a semiconductor portion (e.g., in a semiconductor layer, in a semiconductor die, etc.). The gate structure 408 may allow for a control an electrical behavior of the channel region 402. The gate structure 408 may, for example, be used to control (e.g., allow or prevent) a current flow in the channel region 402. In other words, the gate structure 408 may, for example, allow to control (e.g., allow or prevent) a source/drain current, $I_{SD}$, from a first source/drain region of the field-effect transistor structure 400-1 to a second source/drain region of the field-effect transistor structure 400-1 (the source/drains are provided in or adjacent to the channel but are not shown in FIG. 4A and FIG. 4B). With respect to the operation of the field-effect transistor structure 400-1, a voltage (illustratively an electrical potential) may be provided at (e.g., supplied to) the gate electrode 406 to control the current flow, $I_{SD}$, in the channel region 402, the current flow, $I_{SD}$, in the channel region 402 being caused by voltages supplied via the source/drain regions. The gate electrode 406 may be connected to the control terminal 108 of the memory cell 102. The gate electrode 406 may provide the control terminal 108 of the memory cell 102. A voltage may be provided at the gate electrode 406 via the control terminal 108, for example by applying a voltage (e.g., a select voltage, $V_{sel}$) at the control terminal 108. According to various aspects, the electrical behavior of the cannel region 402 may be influenced by the memory element 405 (e.g. by a polarized ferroelectric material, a charged layer, etc.).

According to various aspects, a source region of the field-effect transistor structure 400-1 may be connected to the source terminal 104 of the memory cell 102. For example, the source region may provide the source terminal 104 of the memory cell 102.

According to various aspects, a drain region of the field-effect transistor structure 400-1 may be connected to the drain terminal 106 of the memory cell 102. For example, the drain region may provide the drain terminal 106 of the memory cell 102.

According to various aspects, the field-effect transistor structure 400-1 may include a bulk terminal. The bulk terminal may be connected to the channel region 402. The bulk terminal may be further connected to the source terminal 104.

According to various aspects, one or more electrical properties of the channel region 402 may be a function of a select voltage, $V_{sel}$, applied at the control terminal 108, a source voltage, $V_S$, present at the source terminal 104, and a memory state of the memory element 405.

According to various aspects, the read-out circuit 110 may be configured to generate the characteristic voltage, $V_{char}$, at the bitline 112 via a temporary current flow, $I_{SD}$, through the channel region 402.

As illustrated by the circuit equivalent in FIG. 4A, the channel region 402, the gate isolation 404, the memory element 405, and the gate electrode 406 may have a capacitance, $C_{FeFET}$, associated therewith (e.g., a capacitance associated with the ferroelectric FET), originating from the more or less conductive regions (the channel region 402 and the gate electrode 406) separated from one another by the gate isolation 404 and the memory element 405. Illustratively, the channel region 402 may be considered as a first capacitor electrode, the gate electrode 406 as a second capacitor electrode, the gate isolation 404 as a dielectric medium between the two capacitor electrodes, and the memory element 405 as a ferroelectric capacitance, originating from the polarization of the memory element 405, influencing the above capacitance. The capacitance, $C_{FeFET}$, of the field-effect transistor structure 400-1 may define one or more operating properties of the field-effect transistor structure 400-1.

FIGS. 4C to 4I show a schematic functioning of a field-effect transistor structure, according to various aspects.

Figure 4C:
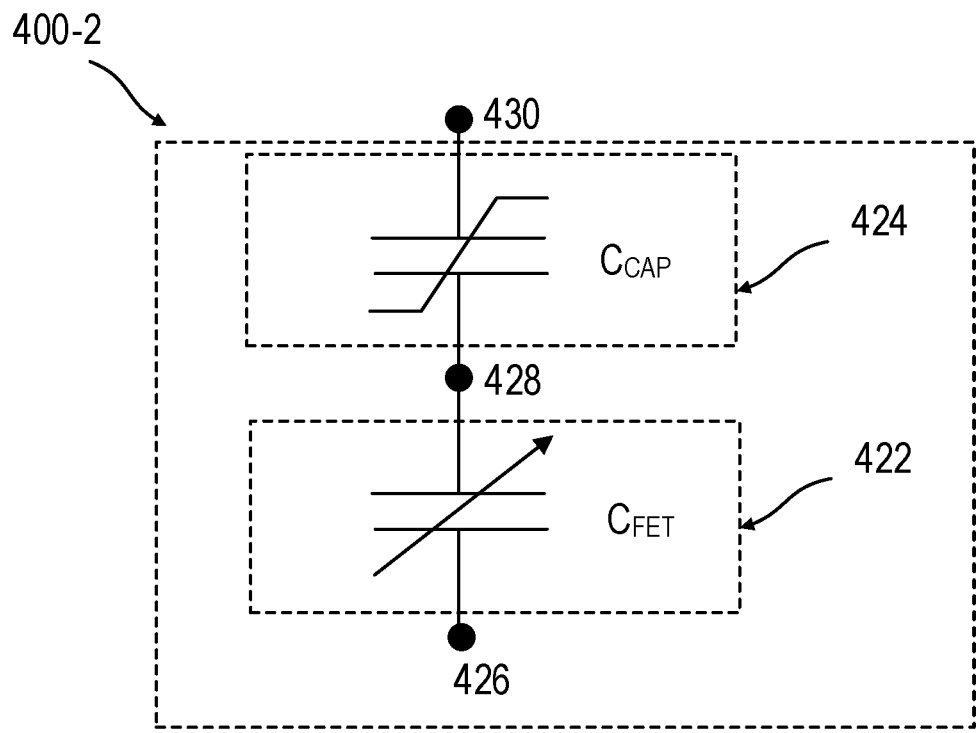

FIG. 4C shows a circuit equivalent of a memory cell 102 including a field-effect transistor structure 400-2. The field-effect transistor structure 400-2 may include a field-effect transistor structure 422. The field-effect transistor structure 422 may correspond substantially to the field-effect transistor structure 400-1 without the memory element 504. The field-effect transistor structure 400-2 may include a capacitive memory structure 424. The capacitive memory structure 424 may be coupled to the field-effect transistor structure 400-2 (in some aspects referred to as FeCAP-coupled FET), according to various aspects. The field-effect transistor structure 400-2 may have a first capacitance, $C_{FET}$, associated with the field-effect transistor structure 422 and the capacitive memory structure 424 may have a second capacitance, $C_{CAP}$, associated therewith.

The field-effect transistor structure 422 and the capacitive memory structure 424 may be coupled (e.g., electrically connected) to one another such that a capacitive voltage divider is provided. The channel or bulk node of the field-effect transistor structure 422 may provide or may be connected to a first node 426, an electrode of the capacitive memory structure 424 may provide or may be connected to a second node 430 and an intermediate conductive portion (electrode, layer, etc.) may provide or may be connected to a floating intermediate node 428. Exemplary realizations of such connected structures will be described in further detail below, for example in relation to FIG. 4E to FIG. 4G.

The capacitive voltage divider formed by the field-effect transistor structure 422 and the capacitive memory structure 424 may allow adapting the capacitances $C_{FET}$, $C_{CAP}$ of the respective capacitors to allow an efficient programming of the capacitive memory structure 424. The overall gate voltage required for switching the memory cell 102 from one memory state into another memory state (e.g. from high threshold voltage state to low threshold voltage state, as described below), may become smaller in case the voltage distribution across the field-effect transistor structure 422 and the capacitive memory structure 424 is adapted such that more of the applied gate voltage drops across the functional layer of the capacitive memory structure 424 (e.g., across a remanent-polarizable layer, such as a ferroelectric layer) than across the gate isolation of the field-effect transistor structure 422. The overall write voltage (illustratively, applied via the nodes 426, 430 to which the field-effect transistor structure 422 and the capacitive memory structure 424 are connected) may thus be reduced by adapting the capacitive voltage divider. The voltage distribution may be determined by voltage divider calculations for a series connection of the capacitors.

Figure 4D:
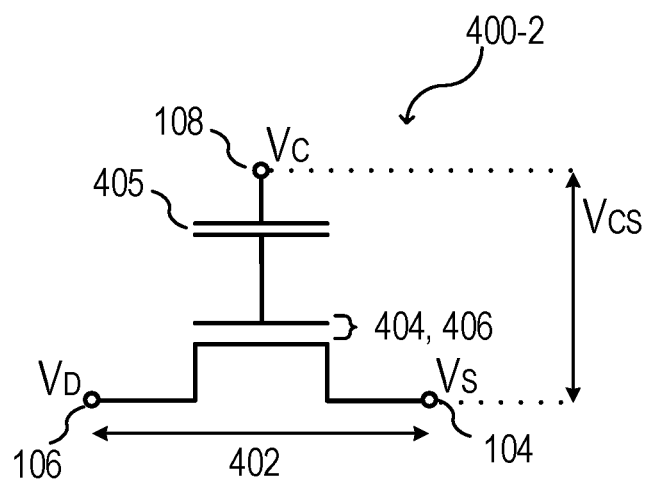

FIG. 4D shows an equivalent circuit of an exemplary field-effect transistor structure 400-2, and FIG. 4E to FIG. 4I illustrate schematically possible realizations of a respective memory cell 400e, 400f, 400g, 400h, 400i.

Each of the described memory cells 400e, 400f, 400g, 400h, 400i may include a field-effect transistor structure 422 including a channel region 402, a gate isolation 404, and a gate electrode 408.

Each of the described memory cells 400e, 400f, 400g, 400h, 400i may include a capacitive memory structure 424 electrically connected (in other words, electrically coupled) with the field-effect transistor structure 422. The capacitive memory structure 424 may include any type of planar or non-planar design with at least a first electrode 442, a second electrode 446, and a memory element 444 (e.g., at least one remanent-polarizable layer) disposed between the first electrode 442 and the second electrode 446, e.g. to provide memory functions. The memory element 444 may be configured as memory element 405.

Figure 4E:
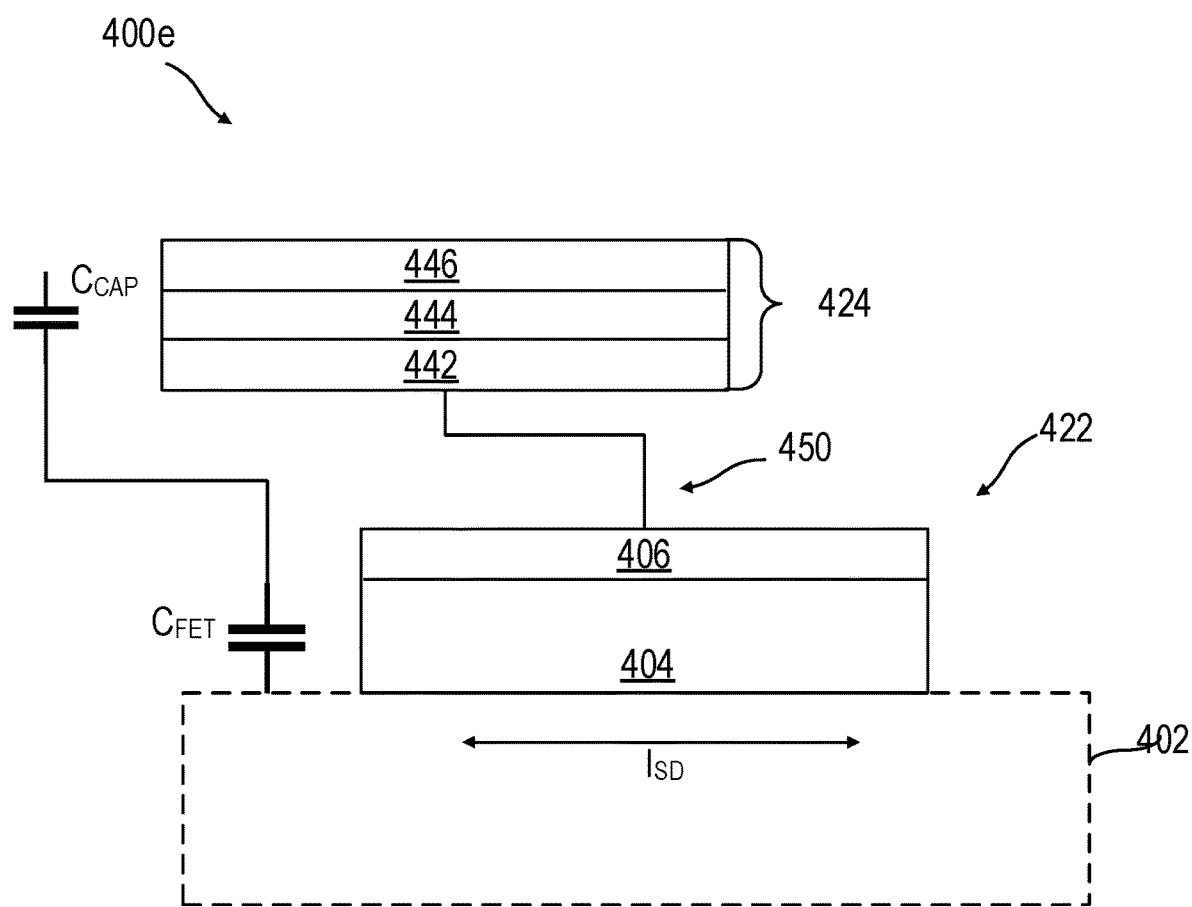

In some aspects, the gate electrode 406 of the field-effect transistor structure 302a may be electrically conductively connected to the first electrode 442 of the capacitive memory structure 424 via an electrically conductive (e.g., ohmic) connection 450, as shown in FIG. 4E. In some aspects, the first electrode 442 of the capacitive memory structure 424 may be in direct physical contact with the gate electrode 406 of the field-effect transistor structure 422.

Figure 4F:
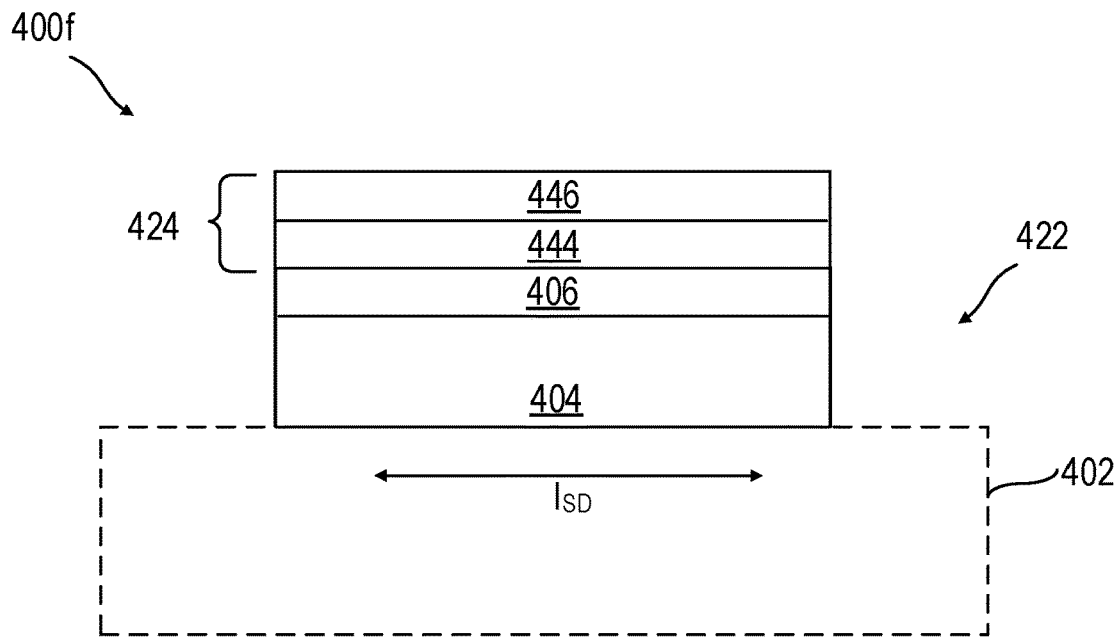

In some aspects, the capacitive memory structure 424 and the field-effect transistor structure 422 may share a common electrode acting as gate electrode of the field-effect transistor structure 422 and electrode of the capacitive memory structure 424, as shown in FIG. 4F.

Figure 4G:
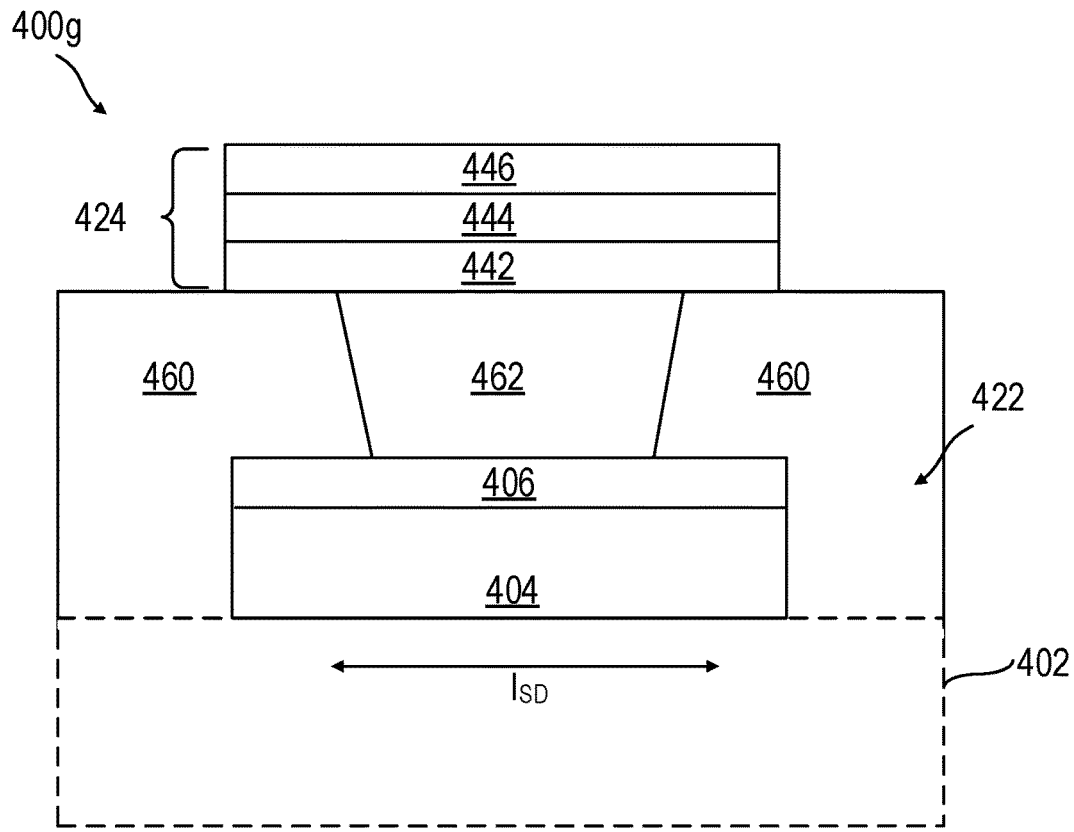

In some aspects, the electrically conductive (e.g., ohmic) connection 450 between the field-effect transistor structure 422 and the capacitive memory structure 424 may be provided by one or more metallization structures 460, 462 disposed over the field-effect transistor structure 422, as shown in FIG. 4G.

A further metallization structure (shown, for example, in FIG. 4H and FIG. 4I) may be formed over the capacitive memory structure 424. The further metallization structure may include a memory contact structure (also referred to as memory contact). The memory contact structure may be embedded in (e.g., may be laterally surrounded by) a further (e.g., second) insulator layer.

Figure 4H:
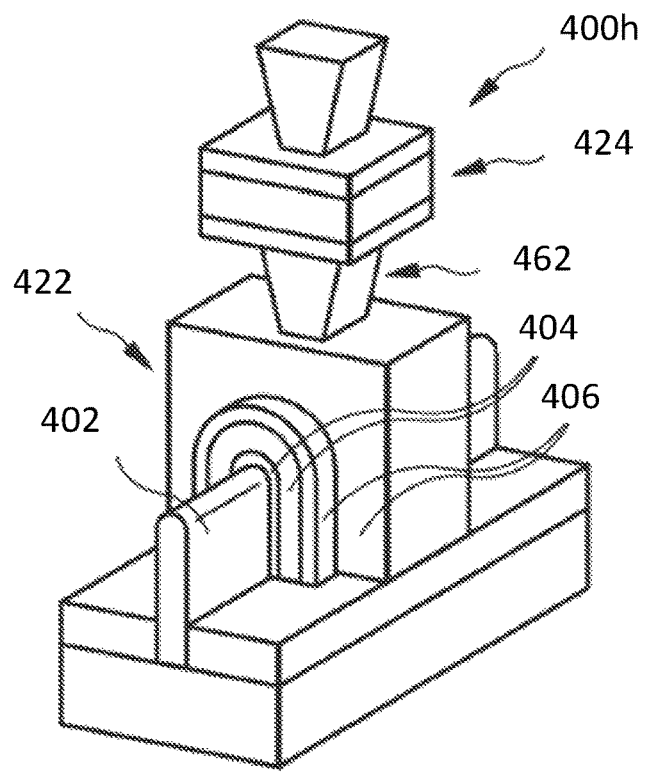
Figure 4I:
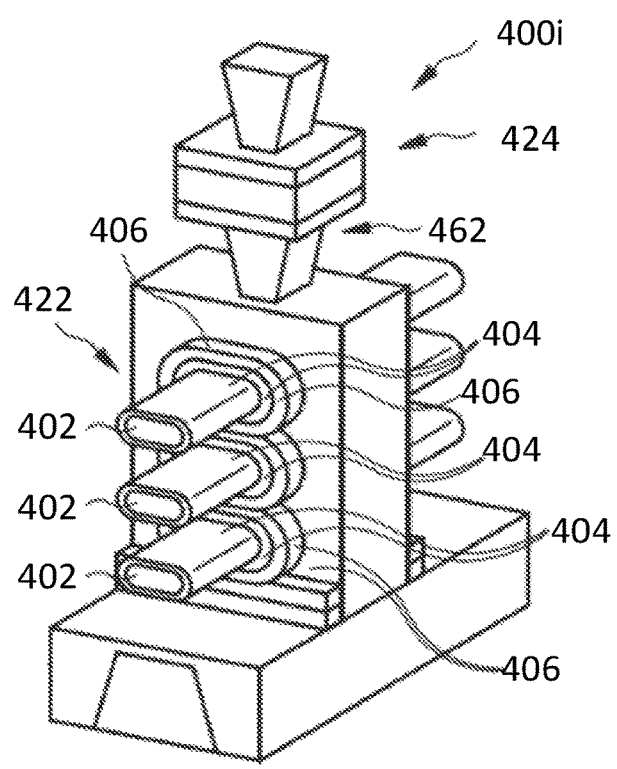

FIG. 4H and FIG. 4I illustrate possible non-planar structures for a memory cell 400h, 400i, e.g. for a field-effect transistor structure 302a (e.g., for a memory transistor described above).

In the integration scheme shown in FIG. 4H, at least the field-effect transistor structure 422 of the memory cell 400h may be configured as a fin field-effect transistor (FinFET). The semiconductor portion 402 in which the channel region is provided may have the shape of a vertical fin, wherein the gate isolation 404 and the gate electrode 406 may at least partially surround the fin.

In the integration scheme shown in FIG. 4I, at least the field-effect transistor structure 422 of the memory cell 400i may be configured as a nanosheet or nanowire field-effect transistor. The one or more semiconductor portions 402, in which a channel region is provided, may each have the shape of a nanosheet or nanowire. The gate isolation 404 and the gate electrode 406 may at least partially surround the respective nanosheets or nanowires.

Figure 5:
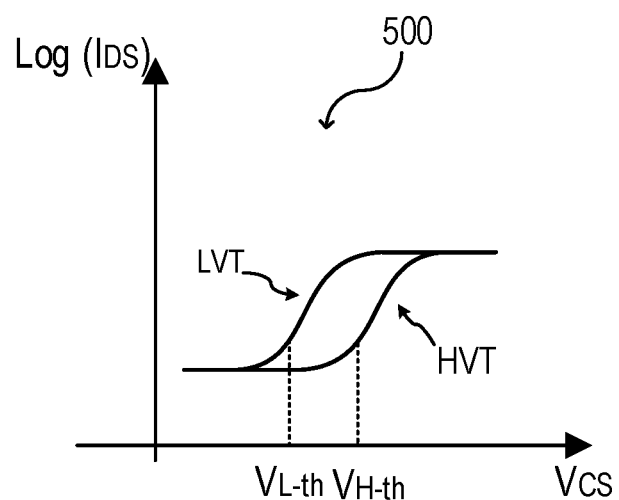
FIG. 5 shows a current/voltage characteristic of a memory cell, according to various aspects.

FIG. 5 illustrates an electrical behavior of exemplary configurations of a memory cell 102, according to various aspects. The diagram 500 shows a current/voltage (I-V) characteristic of the memory cell 102, wherein the logarithm of a current flow from the drain terminal 106 to the source terminal 104, $Log(I_{DS})$, e.g. referred to as drain-source current, $I_{DS}$, (in some aspects referred to as source-drain current $I_{SD}$) is plotted versus the control-source voltage, $V_{CS}$. The diagram 500 may refer, for example, to memory cell including an n-FET.

The drain-source current, $I_{DS}$, may vary as a function of the control-source voltage, $V_{CS}$, and/or as a function of the memory state (e.g. LVT state or HVT state) the memory cell 102 is residing in.

Figure 6A:
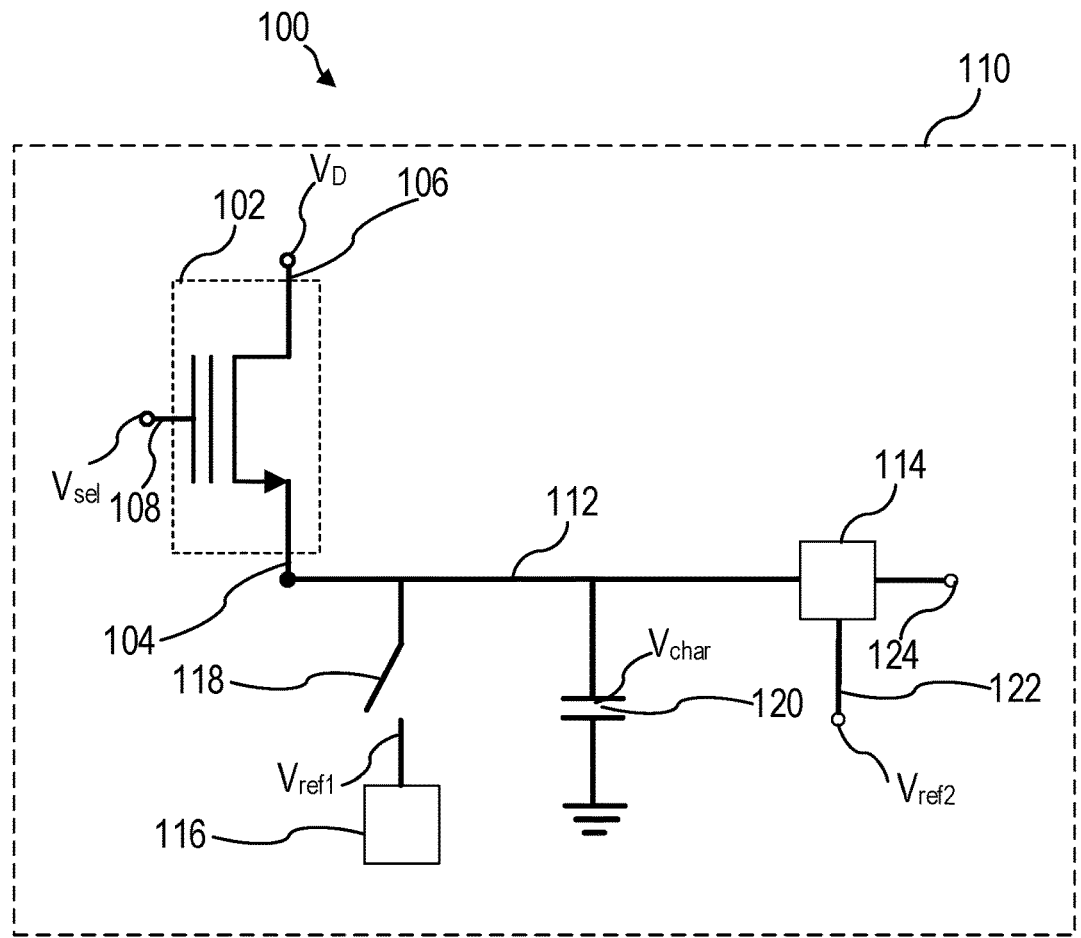
FIG. 6A schematically shows a memory cell arrangement with a memory cell including an n-type field-effect transistor structure, according to various aspects.

FIG. 6A illustrates schematically a memory cell arrangement 100 with a memory cell including an (e.g., enhancement) n-type field-effect transistor structure (n-FET), according to various aspects. In FIG. 6A, the n-FET is illustrated in accordance with the exemplary memory cell shown in FIG. 4A (such that the n-FET may be an n-FeFET), however, it is noted that the memory cell 102 may be any other kind of memory cell including an n-FET structure, such as a FeCAP-coupled n-FET (see, for example, FIG. 4D).

According to various aspects, the n-FET may include an n-type doped source region, an n-type doped drain region, and a p-type doped channel region.

According to various aspects, the read-out circuit 110 may be configured to carry out the reset operation to reset a voltage of the bitline 112 connected with the source terminal 104 of the memory cell 102. The reset operation may include: discharging the bitline 112 to the first reference voltage, $V_{ref1}$. For example, the bitline 112 may be discharged by connecting the bitline 112 to the voltage source/sink 116 (e.g., configured as voltage sink), for example, via the switch 118.

According to various aspects, the read-out circuit 110 may be configured read out the memory cell 102 by the read-out operation including: to apply the select voltage, $V_{sel}$, at the control terminal 108 of the memory cell 102 and to provide the drain voltage, $V_D$, at the drain terminal 106 of the memory cell 102 to charge the bitline 112 connected with the source terminal 104 of the memory cell 102 to the characteristic voltage, $V_{char}$, and to determine the memory state of the memory cell 102 based on the characteristic voltage, $V_{char}$. The read-out circuit 110 may be configured to apply the select voltage, $V_{sel}$, at the control terminal 108 of the memory cell 102 and the drain voltage, $V_D$, at the drain terminal 106 of the memory cell 102 such that a charging current from the drain terminal 106 through the channel region 402 of the memory cell 102 to the source terminal 104 is provided.

The memory cell 102 may be configured to control a current flow from the drain terminal 106 to the source terminal 104 as a function of a voltage difference, $V_{CS}$, between the control terminal 108 and the source terminal 104. The memory cell 102 may have a first threshold voltage, $V_{L-th}$, in the first memory state and a second threshold voltage, $V_{H-th}$, in the second memory state. The first threshold voltage, $V_{L-th}$, may be different from the second threshold voltage, $V_{H-th}$. For example, with respect to FIG. 6B, the first threshold voltage, $V_{L-th}$, may be more negative than the second threshold voltage, $V_{H-th}$. The select voltage, $V_{sel}$, applied at the control terminal 108 of the memory cell 102 may include a voltage value such that the voltage difference, $V_{CS}$, between the control terminal 108 and the source terminal 104 is greater than the first threshold voltage, $V_{L-th}$. For example, the select voltage, $V_{sel}$, applied at the control terminal 108 of the memory cell 102 may include a voltage value such that the voltage difference, $V_{CS}$, between the control terminal 108 and the source terminal 104 is greater than the first threshold voltage, $V_{L-th}$, and the second threshold voltage, $V_{H-th}$.

According to various aspects, the memory cell 102 may be configured to charge the bitline 112 in the case that the voltage difference, $V_{CS}$, between the control terminal 108 and the source terminal 104 is greater than the threshold voltage associated with the memory state of the memory cell 102 (e.g., the first threshold voltage, $V_{L-th}$, for the first memory state and the second threshold voltage, $V_{H-th}$, for the second memory state). The memory cell 102 may be configured to stop charging (e.g., stop charging substantially) the bitline 112 in the case that the voltage difference, $V_{CS}$, between the control terminal 108 and the source terminal 104 is equal to or lower than the threshold voltage associated with the memory state of the memory cell 102.

The first threshold voltage, $V_{L-th}$, may be more negative than the second threshold voltage, $V_{H-th}$. In consequence, the memory cell 102 may charge the bitline 112 to a more positive voltage value for the first memory state as compared to the second memory state. The first characteristic voltage, $V_{char1}$, associated with the first memory state (e.g., LVT state) may be more positive than the second characteristic voltage, $V_{char2}$, associated with the second memory state (e.g., HVT state).

The second reference voltage, $V_{ref2}$, may include a voltage value in a range between the voltage value of the first characteristic voltage, $V_{char1}$, and the voltage value of the second characteristic voltage, $V_{char2}$. For example, the second reference voltage, $V_{ref2}$, may include a voltage value substantially in the middle of the voltage range defined by the voltage value of the first characteristic voltage, $V_{char1}$, and the voltage value of the second characteristic voltage, $V_{char2}$. The read-out circuit 110 (e.g., the sensing circuit 114) may be configured to determine the first memory state in the case that a characteristic voltage, $V_{char}$, is more positive than the second reference voltage, $V_{ref2}$, and may be configured to determine the second memory state in the case that a characteristic voltage, $V_{char}$, is more negative than the second reference voltage, $V_{ref2}$.

According to various aspects, the first reference voltage, $V_{ref1}$, may include a voltage value more negative than the first characteristic voltage, $V_{char1}$. For example, the first reference voltage, $V_{ref1}$, may include a voltage value more negative than the first characteristic voltage, $V_{char1}$, and more negative than the second characteristic voltage, $V_{char2}$.

As described above, the read-out circuit 110 may be configured to determine the memory state of the memory cell 102 by comparing the characteristic voltage, $V_{char}$, generated at the bitline 112 to the second reference voltage, $V_{ref2}$, and to the third reference voltage, $V_{ref3}$. According to various aspects, the third reference voltage, $V_{ref3}$, may be in a range between the first reference voltage, $V_{ref1}$, and the second characteristic voltage, $V_{char2}$. The read-out circuit 110 may be configured (e.g., using the at least one voltage comparator 314) to determine the first memory state in the case that a characteristic voltage, $V_{char}$, generated at the bitline 112 is more positive than the second reference voltage, $V_{ref2}$, and may be configured to determine the second memory state in the case that a characteristic voltage, $V_{char}$, is more positive than the third reference voltage, $V_{ref3}$. According to various aspects, the read-out circuit 110 may be configured to determine a read-out error for a characteristic voltage, $V_{char}$, more negative than the third reference voltage, $V_{ref3}$.

Figure 6B:
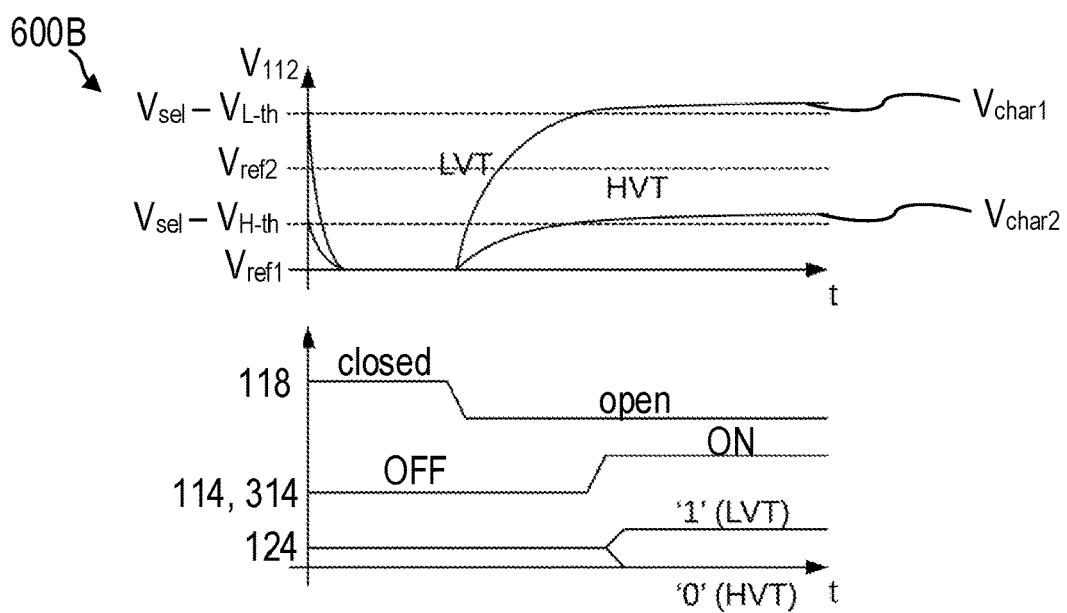
FIG. 6B shows a timing diagram for an exemplary operation of a memory cell arrangement with a memory cell including an n-type field-effect transistor structure.

FIG. 6B illustrates a timing diagram 600B for an exemplary operation of a memory cell arrangement 100 with a memory cell 102 including an n-type field-effect transistor structure. The timing diagram 600B shows the voltage, $V_{112}$, present at the bitline 112 (for example, generated at the bitline 112) as a function of time. In the following, the exemplary operation of the memory cell 102 including the n-FET is described in connection with FIG. 6A and FIG. 6B.

As described above, during a read-out operation the bitline 112 may be charged to a voltage difference, $V_{CS}$, between the control terminal 108 and the source terminal 104 being substantially equal to or more negative than the threshold voltage associated with the memory state of the memory cell 102. For example, after a previous read-out operation, the bitline 112 may be charged to a voltage defined by the difference of the select voltage, $V_{sel}$, and the first threshold voltage, $V_{L-th}$, (e.g., substantially equal to the difference, $V_{sel}-V_{L-th}$, of the select voltage, $V_{sel}$, and the first threshold voltage, $V_{L-th}$) for the first memory state (the LVT state) and the bitline 112 may be charged to a voltage defined by the difference of the select voltage, $V_{sel}$, and the second threshold voltage, $V_{H-th}$, (e.g., substantially equal to the difference, $V_{sel}-V_{H-th}$, of the select voltage, $V_{sel}$, and the second threshold voltage, $V_{H-th}$) for the second memory state (the HVT state)

The read-out circuit 110 may be configured to reset the voltage of the bitline 112 by connecting the bitline 112 to the voltage source/sink 116 (e.g., configured as voltage sink), for example, by closing the switch 118, such that the bitline 112 may be discharged to the first reference voltage, $V_{ref1}$ (e.g., to the base voltage). The sensing circuit 114 (e.g., the at least one voltage comparator 314) may be "OFF" during the reset operation, thus providing no output (e.g. no detection of the memory state) at the output terminal 124.

The read-out circuit 110 may be configured to perform the read-out operation, for example, subsequent to the reset operation. The read-out circuit 110 may be configured to open the switch 118. The read-out circuit 110 may be configured to apply the select voltage, $V_{sel}$, at the control terminal 108 of the memory cell 102 and the drain voltage, $V_D$, at the drain terminal 106 of the memory cell 102 to charge the bitline 112 to the characteristic voltage, $V_{char}$. For the memory cell 102 being in the first memory state (the LVT state), the read-out circuit 110 may be configured to charge the bitline 112 via the memory cell 102 to the first characteristic voltage, $V_{char1}$. For the memory cell 102 being in the second memory state (the HVT state), the read-out circuit 110 may be configured to charge the bitline 112 via the memory cell 102 to the second characteristic voltage, $V_{char2}$.

The read-out operation may further include sensing the characteristic voltage, $V_{char}$, to determine the memory state of the memory cell 102. The read-out circuit 110 may be configured to switch "ON" the sensing circuit 114 (e.g., the at least one voltage comparator 314) to provide an output at the output terminal 124. The sensing circuit 114 may be configured compare the characteristic voltage, $V_{char}$, to the second reference voltage, $V_{ref2}$. The second reference voltage, $V_{ref2}$, may include a voltage value in the range between the voltage value of the first characteristic voltage, $V_{char1}$, and the voltage value of the second characteristic voltage, $V_{char2}$. The sensing circuit 114 may be configured to provide a first output 124 corresponding to a logic "1" for the first memory state (LVT state) and a second output 124 corresponding to a logic "0" for the second memory state (HVT state).

Figure 6C:
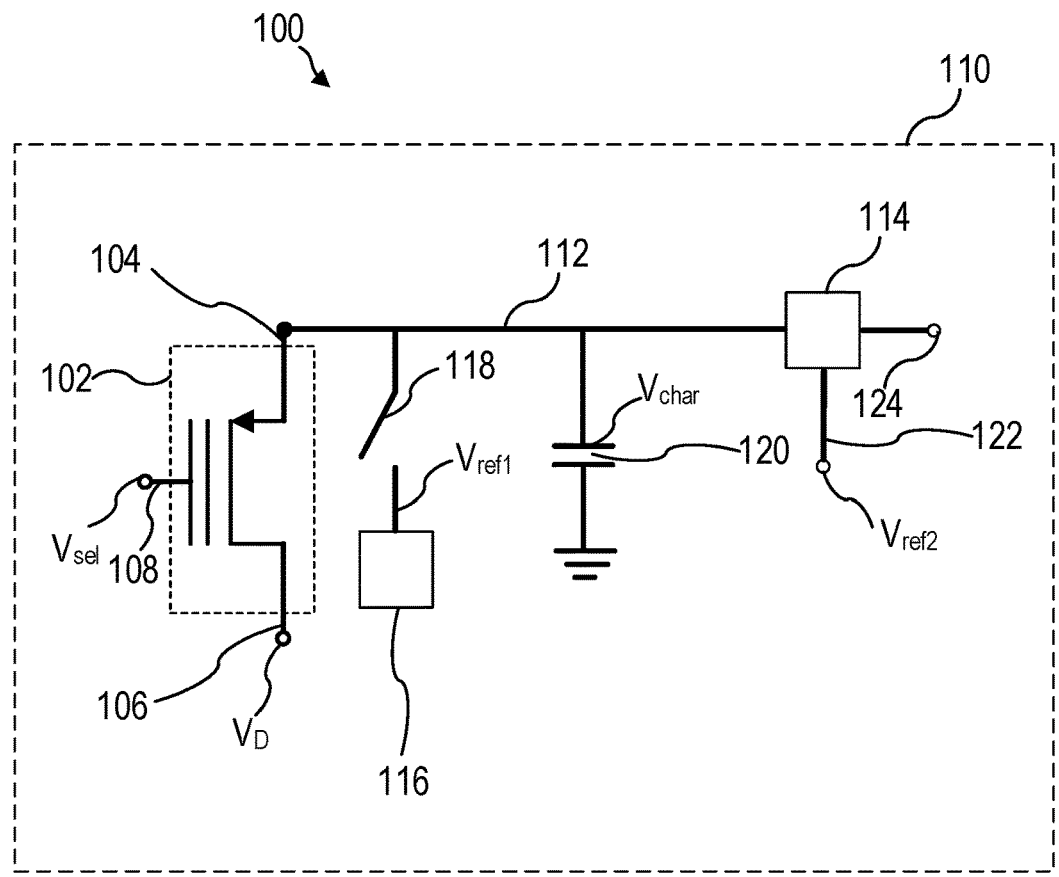
FIG. 6C schematically shows a memory cell arrangement with a memory cell including a p-type field-effect transistor structure, according to various aspects.

FIG. 6C illustrates schematically a memory cell arrangement 100 with a memory cell including a (e.g., an enhancement) p-type field-effect transistor structure (p-FET), according to various aspects. In FIG. 6C, the p-FET is illustrated in accordance with the exemplary memory cell shown in FIG. 4A (such that the p-FET may be a p-FeFET), however, it is noted that the memory cell 102 may be any other kind of memory cell including a p-FET structure, such as a FeCAP-coupled p-FET (see, for example, FIG. 4D).

According to various aspects, the p-FET may include a p-type doped source region, a p-type doped drain region, and an n-type doped channel region.

According to various aspects, the read-out circuit 110 may be configured reset the voltage of the bitline 112 connected with the source terminal 104 of the memory cell 102 the memory cell 102 by the reset operation. The reset operation may include: to charge the bitline 112 to the first reference voltage, $V_{ref1}$, by connecting the bitline 112 to the voltage source/sink 116 (e.g., configured as voltage source), for example, via the switch 118.

According to various aspects, the read-out circuit 110 may be configured to read out the memory cell 102 by the read-out operation including: to discharge the bitline 112 connected with the source terminal 104 of the memory cell 102 to the characteristic voltage, $V_{char}$, by applying the select voltage, $V_{sel}$, at the control terminal 108 of the memory cell 102 and by applying the drain voltage, $V_D$, (e.g., the base voltage) at the drain terminal 106 of the memory cell 102, and to determine the memory state of the memory cell 102 based on the characteristic voltage, $V_{char}$. The read-out circuit 110 may be configured to apply the select voltage, $V_{sel}$, at the control terminal 108 of the memory cell 102 and the drain voltage, $V_D$, at the drain terminal 106 of the memory cell 102 such that a discharging current from the source terminal 104 through the channel region 402 of the memory cell 102 to the drain terminal 106 is provided.

The memory cell 102 may be configured to control a current flow from the source terminal 104 to the drain terminal 106 as a function of a voltage difference, $V_{CS}$, between the control terminal 108 and the source terminal 104. The select voltage, $V_{sel}$, applied at the control terminal 108 of the memory cell 102 may include a voltage value such that the voltage difference, $V_{CS}$, between the control terminal 108 and the source terminal 104 is greater than the first threshold voltage, $V_{L-th}$. For example, the select voltage, $V_{sel}$, applied at the control terminal 108 of the memory cell 102 may include a voltage value such that the voltage difference, $V_{CS}$, between the control terminal 108 and the source terminal 104 is greater than the first threshold voltage, $V_{L-th}$, and the second threshold voltage, $V_{H-th}$.

According to various aspects, the memory cell 102 may be configured to discharge the bitline 112 in the case that the voltage difference, $V_{CS}$, between the control terminal 108 and the source terminal 104 is greater than the threshold voltage (e.g., with respect to the absolute values) associated with the memory state of the memory cell 102 (e.g., the first threshold voltage, $V_{L-th}$, for the first memory state and the second threshold voltage, $V_{H-th}$, for the second memory state). The memory cell 102 may be configured to stop discharging (e.g., stop discharging substantially) the bitline 112 in the case that the voltage difference, $V_{CS}$, between the control terminal 108 and the source terminal 104 is equal to or lower than the threshold voltage (e.g., with respect to the absolute values) associated with the memory state of the memory cell 102.

The first threshold voltage, $V_{L-th}$, may have a voltage value more negative than the second threshold voltage, $V_{H-th}$. In consequence, the memory cell 102 may discharge the bitline 112 to a more negative voltage value for the first memory state as compared to the second memory state. The first characteristic voltage, $V_{char1}$, associated with the first memory state (e.g., LVT state) may be more negative than the second characteristic voltage, $V_{char2}$, associated with the second memory state (e.g., HVT state).

The second reference voltage, $V_{ref2}$, may include a voltage value in a range between the voltage value of the first characteristic voltage, $V_{char1}$, and the voltage value of the second characteristic voltage, $V_{char2}$. For example, the second reference voltage, $V_{ref2}$, may include a voltage value substantially in the middle of the voltage range defined by the voltage value of the first characteristic voltage, $V_{char1}$, and the voltage value of the second characteristic voltage, $V_{char2}$. The read-out circuit 110 (e.g., the at least one voltage comparator 314) may be configured to determine the first memory state in the case that a characteristic voltage, $V_{char}$, is more negative than the second reference voltage, $V_{ref2}$. The read-out circuit 110 (e.g., the at least one voltage comparator 314) may be configured to determine the second memory state in the case that a characteristic voltage, $V_{char}$, is more positive than the second reference voltage, $V_{ref2}$.

According to various aspects, the first reference voltage, $V_{ref1}$, may include a voltage value more positive than the first characteristic voltage, $V_{char1}$. For example, the first reference voltage, $V_{ref1}$, may include a voltage value more positive than the first characteristic voltage, $V_{char1}$, and higher than the second characteristic voltage, $V_{char2}$.

As described above, the read-out circuit 110 may be configured to determine the memory state of the memory cell 102 by comparing the characteristic voltage, $V_{char}$, generated at the bitline 112 to the second reference voltage, $V_{ref2}$, and to the third reference voltage, $V_{ref3}$. According to various aspects, the third reference voltage, $V_{ref3}$, may be in a range between the first reference voltage, $V_{ref1}$, and the second characteristic voltage, $V_{char2}$. The read-out circuit 110 may be configured (e.g., using the at least one voltage comparator 314) to determine the first memory state in the case that a characteristic voltage, $V_{char}$, generated at the bitline 112 is more negative than the second reference voltage, $V_{ref2}$. The read-out circuit 110 may be configured to determine the second memory state in the case that a characteristic voltage, $V_{char}$, is more negative than the third reference voltage, $V_{ref3}$. According to various aspects, the read-out circuit 110 may be configured to determine a read-out error for a characteristic voltage, $V_{char}$, being more positive than the third reference voltage, $V_{ref3}$.

Figure 6D:
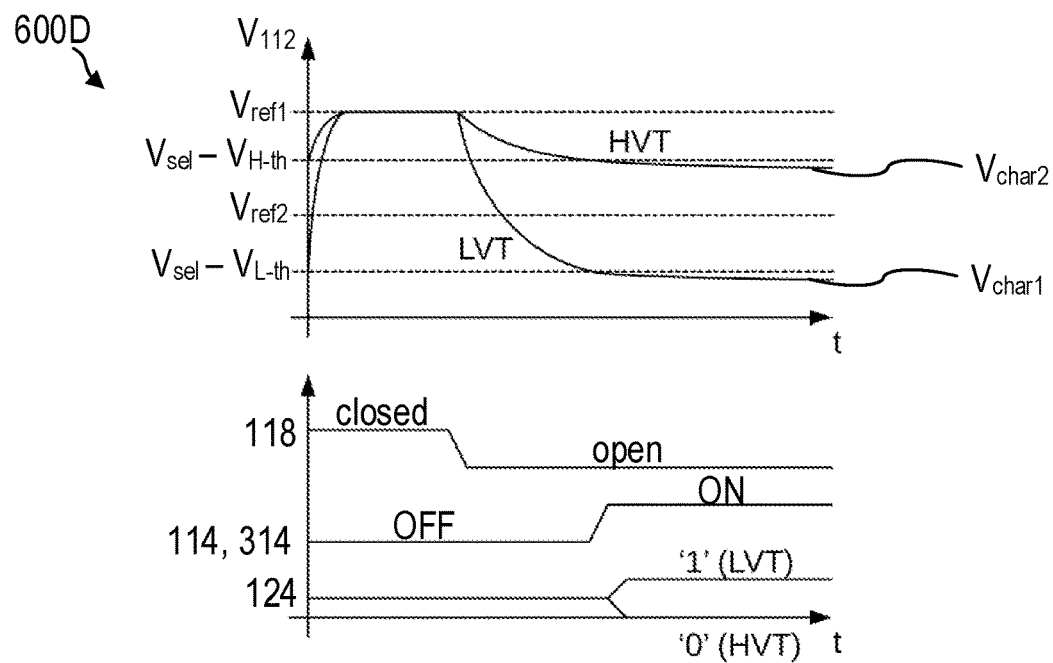
FIG. 6D shows a timing diagram for an exemplary operation of a memory cell arrangement with a memory cell including an n-type field-effect transistor structure.

FIG. 6D illustrates a timing diagram 600D for an exemplary operation of a memory cell arrangement 100 with a memory cell 102 including a (e.g., an enhancement) p-type field-effect transistor structure. The timing diagram 600D shows the voltage, $V_{112}$, present at the bitline 112 (e.g., generated at the bitline 112) as a function of time. In the following the exemplary operation of the memory cell 102 including the p-FET is described in connection with FIG. 6C and FIG. 6D.

As described above, during a read-out operation the bitline 112 may be discharged to a voltage difference, $V_{CS}$, between the control terminal 108 and the source terminal 104 lower than the threshold voltage associated with the memory state of the memory cell 102. For example, after a previous read-out operation, the bitline 112 may be discharged to a voltage defined by the difference of the select voltage, $V_{sel}$, and the first threshold voltage, $V_{L-th}$, (e.g., substantially equal to the difference, $V_{sel}-V_{L-th}$, of the select voltage, $V_{sel}$, and the first threshold voltage, $V_{L-th}$) for the first memory state (the LVT state) and the bitline 112 may be discharged to a voltage defined by the difference of the select voltage, $V_{sel}$, and the second threshold voltage, $V_{H-th}$, (e.g., substantially equal to the difference, $V_{sel}-V_{H-th}$, of the select voltage, $V_{sel}$, and the second threshold voltage, $V_{H-th}$) for the second memory state (the HVT state)

The read-out circuit 110 may be configured to carry out the reset operation (e.g., to reset the voltage of the bitline 112) by connecting the bitline 112 to the voltage source/sink 116 (e.g., configured as voltage source), for example, by closing the switch 118, such that the bitline 112 is charged to the first reference voltage, $V_{ref1}$. The sensing circuit 114 (e.g., the at least one voltage comparator 314) may be "OFF" during carrying out the reset operation, thus providing no output (e.g. no detection of the memory state) at the output terminal 124.

The read-out circuit 110 may be configured to perform the read-out operation, for example, subsequent to the reset of the bitline 112. The read-out circuit 110 may be configured to open the switch 118. The read-out circuit 110 may be configured to apply the select voltage, $V_{sel}$, at the control terminal 108 of the memory cell 102 and the drain voltage, $V_D$, at the drain terminal 106 of the memory cell 102 to discharge the bitline 112 to the characteristic voltage, $V_{char}$. In the case that the memory cell 102 is in the first memory state (the LVT state), the read-out circuit 110 may be configured to discharge the bitline 112 via the memory cell 102 to the first characteristic voltage, $V_{char1}$. In the case that the memory cell 102 is in the second memory state (the HVT state), the read-out circuit 110 may be configured to discharge the bitline 112 via the memory cell 102 to the second characteristic voltage, $V_{char2}$.

The read-out operation may further include sensing the characteristic voltage, $V_{char}$, to determine the memory state of the memory cell 102. The read-out circuit 110 may be configured to switch "ON" the sensing circuit 114 (e.g., the at least one voltage comparator 314) to provide an output at the output terminal 124. The sensing circuit 114 may be configured compare the characteristic voltage, $V_{char}$, to the second reference voltage, $V_{ref2}$. The second reference voltage, $V_{ref2}$, may include a voltage value in a range between the voltage value of the first characteristic voltage, $V_{char1}$, and the voltage value of the second characteristic voltage, $V_{char2}$. The sensing circuit 114 may be configured to provide a first output 124 corresponding to a logic "1" for the first memory state (LVT state) and a second output 124 corresponding to a logic "0" for the second memory state (HVT state).

The memory cell arrangement 100 is described exemplarily for a memory cell 102 including an enhancement n-FET (FIG. 6A and FIG. 6B) and for a memory cell 102 including an enhancement p-FET (FIG. 6C and FIG. 6D), however, it is noted that the memory cell 102 may be any type of memory cell that is capable to control a current flow between a first terminal and a second terminal as a function of a first voltage present at the first terminal, a third voltage applied at a third terminal, and a memory state of the memory cell. According to various, the bitline 112 may be charged or discharged depending on the type of the memory cell (e.g., the type of the FET) and/or depending on the applied voltages (e.g., depending on the select voltage, the drain voltage, and/or the first reference voltage).

FIG. 7 shows a schematic flow diagram of a method 700, e.g., a method for reading a memory cell, according to various aspects. The method 700 may include generating a characteristic voltage at a bitline connected to a first terminal (e.g., a source terminal) of a memory cell by applying a second voltage at a second terminal (e.g., a drain terminal) of the memory cell and a third voltage at a third terminal (e.g., a control terminal) of the memory cell (in 702). For example, the method 700 may include generating a characteristic voltage at a bitline connected to a first terminal of a memory cell by applying a third voltage (e.g., a select voltage) at a third terminal of a memory cell and a second voltage at a second terminal of the memory cell to provide. The characteristic voltage may represent a memory state of the memory cell. The method 700 may further include sensing the characteristic voltage, $V_{char}$, to determine the memory state of the memory cell 102 (in 704).

According to various aspects, the method 700 may include charging or discharging the bitline prior to applying the third voltage at the third terminal and the second voltage at the second terminal.

The method 700 may include discharging the bitline prior to applying the select voltage at the third terminal and the second voltage at the second terminal, and may further include applying the third voltage at the third terminal of a memory cell and the second voltage at the second terminal of the memory cell to charge the bitline to the characteristic voltage.

The method 700 may include charging the bitline prior to applying the third voltage at the third terminal and the second voltage at the second terminal, and may further include applying the third voltage at the third terminal of a memory cell and the second voltage at the second terminal of the memory cell to discharge the bitline to the characteristic voltage.

According to various aspects, the method 700 may be a method for reading a memory cell that includes an n-type field-effect transistor structure (e.g., an n-type FeFET or a FeCAP-coupled to an n-type FET) and a memory element. The method 700 may include applying the third voltage at the third terminal of the memory cell and a second voltage at the second terminal of the memory cell to charge the bitline connected to the first terminal of the memory cell via the n-type field-effect transistor structure to the characteristic voltage.

According to various aspects, the method 700 may be a method for reading a memory cell that includes a p-type field-effect transistor structure (e.g., a p-type FeFET or a FeCAP-coupled to a p-type FET) and the memory element. The method 700 may include applying the third voltage at the third terminal of the memory cell and a second voltage at the second terminal of the memory cell to discharge the bitline connected to the first terminal of the memory cell via the p-type field-effect transistor structure to the characteristic voltage.

In the following, various examples are provided that may include one or more aspects described above with reference to the memory cell arrangement 100 and the method 700. It may be intended that aspects described in relation to the memory arrangement 100 may apply also to the method 700, and vice versa.

Example 1 is a memory cell arrangement that may include: a memory cell, the memory cell including a first terminal (e.g., a source terminal), a second terminal (e.g., a drain terminal), and a third terminal (e.g., a control terminal), the memory cell may be configured to allow for a control of a current flow (e.g., to control one or more electrical properties of a channel) between the second terminal and the first terminal as a function of a first voltage present at the first terminal, a third voltage applied at the third terminal, and a memory state of the memory cell; a bitline connected to the first terminal of the memory cell; and a read-out circuit to read out the memory state of the memory cell, the read-out circuit may be configured to: generate a characteristic voltage at the bitline by applying the third voltage at the third terminal of the memory cell and a second voltage at the second terminal of the memory cell, the characteristic voltage representing the memory state of the memory element, and determine the memory state of the memory cell based on sensing the characteristic voltage.

Example 2 is a memory cell arrangement that may include: a memory cell, the memory cell including a first terminal (e.g., a source terminal), a second terminal (e.g., a drain terminal), and a third terminal (e.g., a control terminal), the memory cell may be configured to allow for a control of a current flow (e.g., to control one or more electrical properties of a channel) between the second terminal and the first terminal as a function of a first voltage present at the first terminal, a third voltage applied at the third terminal, and a memory state of the memory cell; a bitline connected to the first terminal of the memory cell; and a read-out circuit configured to carry out a read-out operation to read out the memory state of the memory cell, the read-out operation may include: generating a characteristic voltage at the bitline by applying the third voltage at the third terminal of the memory cell and a second voltage at the second terminal of the memory cell, the characteristic voltage representing the memory state of the memory element, and sensing the characteristic voltage to determine the memory state of the memory cell.

Example 3 is a memory cell arrangement that may include: a memory cell, the memory cell including a source region connected to or providing a source terminal of the memory cell, a drain region connected to or providing a drain terminal of the memory cell, and a gate structure connected to or providing a control terminal of the memory cell, the gate structure including a memory element and configured to control a current flow between the drain terminal and the source terminal as a function of a select voltage applied at the control terminal, a source voltage at the source terminal, and a memory state of the memory element, a bitline connected to the source terminal of the memory cell; and a read-out circuit to read out the memory state of the memory cell by a read-out operation, the read-out operation including: applying the select voltage at the control terminal of the memory cell and a drain voltage at the drain terminal of the memory cell to provide a characteristic voltage at the bitline, the characteristic voltage representing the memory state of the memory element, and sensing the characteristic voltage to determine the memory state of the memory cell.

In Example 4, the subject matter of any one of Examples 1 to 3 can optionally include that the memory cell further may include a bulk terminal (e.g., connected to the channel region), the bulk terminal being connected to the source terminal of the memory cell such that the (or a) current flow between the drain terminal and the source terminal is controlled as a function of the select voltage applied at the control terminal, the source voltage present at the source terminal, and the memory state of the memory element.

Example 5 is a memory cell arrangement that may include: a memory cell including a first terminal (e.g., a source terminal), a second terminal (e.g., a drain terminal), and a third terminal (e.g., a control terminal), the memory cell being configured to control one or more electrical properties of a channel between the second terminal and the first terminal as a function of a first voltage present at the first terminal, a third voltage applied at the third terminal, and a memory state of the memory cell; a bitline connected to the first terminal of the memory cell; and a read-out circuit to carry out a read-out operation to read out the memory state of the memory cell, the read-out operation including: generating a characteristic voltage at the bitline by applying the third voltage at the third terminal of the memory cell and a second voltage at the second terminal of the memory cell, the characteristic voltage representing the memory state of the memory cell, and determine the memory state of the memory cell based on sensing the characteristic voltage.

In Example 6, the subject matter of Example 5 can optionally further include that the memory cell includes a bulk terminal, the bulk terminal being connected to the channel region and being connected to the first terminal of the memory cell such that the current flow between the second terminal and the first terminal is controlled as a function of the third voltage applied at the third terminal, the first voltage at the first terminal, and the memory state of the memory element.

In Example 7, the subject matter of Example 5 or 6 can optionally include that the read-out circuit is configured to provide (e.g., to apply) a reference voltage at the bitline prior to applying the third voltage at the third terminal of the memory cell and the second voltage at the second terminal of the memory.

In Example 8, the subject matter of any one of Examples 1 to 7 can optionally include that the read-out circuit (or a reset circuit) is configured to carry out a reset operation to reset a voltage of the bitline, the reset operation may include: charging or discharging the bitline to the first reference voltage.

In Example 9, the subject matter of Example 8 can optionally include that the read-out circuit may include a switch configured to selectively connect the bitline to a voltage source to charge the bitline to the first reference voltage or to a voltage sink to discharge the bitline to the first reference voltage.

In Example 10, the subject matter of Example 8 or 9 can optionally include that the read-out circuit is configured to carry out the reset operation prior to the read-out operation and/or subsequent to the read-out operation (e.g., between two consecutive read-out operations).

According to a further Example, the subject matter of Example 10 may optionally include that the read-out circuit is configured to carry out a first read-out operation at a first time and a second read-out operation at a second time different from the first time. The read-out circuit may be configured to carry out the reset operation at a third time between the first time and the second time.

In Example 11, the subject matter of any one of Examples 1 to 10 can optionally include that the memory element may include a remanently-polarizable layer (e.g., including a ferroelectric material), and optionally that the memory cell includes a ferroelectric field-effect transistor (FeFET) or a ferroelectric capacitor (FeCAP) coupled to a field-effect transistor.

In Example 12, the subject matter of any one of Examples 1 to 11 can optionally include that the memory cell arrangement further includes plurality of memory cells including the memory cell, each memory cell of the plurality of memory cell may include: a source terminal, a drain terminal, and a control terminal, and wherein the source terminal of one or more memory cells of the plurality of memory cells is connected to the bitline, and wherein optionally the read-out circuit is configured to read out the memory state of one of the plurality of memory cells.

In Example 13, the subject matter of any one of Examples 1 to 12 can optionally include that the memory cell (e.g., the memory element of the memory cell) is writable into one of at least two memory states.

In Example 14, the subject matter of Example 13 can optionally include that each memory state of the at least two memory states of the memory cell is associated with a respective threshold voltage of the memory cell.

In Example 15, the subject matter of any one of Examples 1 to 14 can optionally include that the memory cell may include one of a first threshold voltage (e.g., a low threshold voltage (LVT)) and a second threshold voltage (e.g., a high threshold voltage (HVT)) as a function of a memory state the memory cell is residing in.

In Example 16, the subject matter of Examples 13 and 15 can optionally include that the first threshold voltage is different from the second threshold voltage.

In Example 17, the subject matter of Example 11 and Example 15 or 16 can optionally include that the first threshold voltage is a function of a first residual polarization of the remanent polarizable layer, and that the second threshold voltage is a function of a second residual polarization of the remanent polarizable layer, and wherein optionally the first threshold voltage is a function of a first coercive field of the remanent polarizable layer, and the second threshold voltage is a function of a second coercive field of the remanent polarizable layer.

In Example 18, the subject matter of any one of Examples 13 to 17 can optionally include that each memory state of the at least two memory states corresponds to a characteristic voltage the bitline is charged or discharged to by the read-out operation.

In Example 19, the subject matter of Examples 14 and 18 can optionally include that each of the at least two characteristic voltages (e.g., bijectively) corresponds to one of at least two memory states of the memory cell.

In Example 20, the subject matter of Example 19 can optionally include that determining the memory state of the memory cell includes determining whether the first characteristic voltage or the second characteristic voltage is generated at the bitline.

In Example 21, the subject matter of any one of Examples 1 to 20 can optionally include that determining the memory state of the memory cell includes determining the memory state of the memory cell by comparing the characteristic voltage generated at the bitline to a second reference voltage (e.g., to at least one comparator reference voltage).

In Example 22, the subject matter of Example 21 can optionally include that the second reference voltage includes a constant voltage value or that the second reference voltage includes a voltage value associated with another bitline (e.g., another bitline).

In Example 23, the subject matter of Example 21 or 22 can optionally include that determining the memory state of the memory cell includes determining the memory state of the memory cell by comparing the characteristic voltage generated at the bitline to the second reference voltage and to a third reference voltage.

In Example 24, the subject matter of any one of Examples 1 to 23 can optionally include that the read-out circuit may include at least one voltage comparator (e.g., a latch) to determine the memory state of the memory cell based on the characteristic voltage.

In Example 25, the subject matter of Examples 23 and 24 can optionally include that a first voltage comparator is configured to compare the characteristic voltage generated at the bitline to the second reference voltage and a second voltage comparator is configured to compare the characteristic voltage to a third reference voltage.

In Example 26, the subject matter of any one of Examples 1 to 25 can optionally include that the memory cell may include an enhancement-type field-effect transistor, the enhancement-type field-effect transistor including the source region, the drain region, the channel, and the gate structure.

In Example 27, the subject matter of any one of Examples 1 to 26 can optionally include that the memory cell may include an n-type field-effect transistor, the n-type field-effect transistor including the source region, the drain region, the channel, and the gate structure, and the (or a) read-out operation may include: applying the select voltage at the control terminal of the memory cell and the drain voltage at the drain terminal of the memory cell to charge the bitline connected to the source terminal of the memory cell to the characteristic voltage, and determining the memory state of the memory cell based on sensing the characteristic voltage.

Example 28 is a memory cell arrangement that may include: a memory cell including an enhancement n-type field-effect transistor structure (n-FET), the n-FET including a source region connected to or providing a source terminal of the memory cell, a drain region connected to or providing a drain terminal of the memory cell, a channel region extending between the source region and the drain region, and a gate structure connected to or providing a control terminal of the memory cell, the gate structure including a memory element, wherein one or more electrical properties of the channel region (e.g., a current flow, $I_{SD}$, from the drain region of the n-FET through the channel of the n-FET to the source region of the n-FET) are a function of a select voltage applied at the control terminal, a source voltage at the source terminal, and a memory state of the memory element, a bitline connected to the source terminal of the memory cell; and a read-out circuit configured to carry out a read-out operation to read out the memory state of the memory cell, the read-out operation may include: charging the bitline to a characteristic voltage by applying the select voltage at the control terminal of the memory cell and a drain voltage at the drain terminal of the memory cell, the characteristic voltage representing the memory state of the memory element, and determine the memory state of the memory cell based on sensing the characteristic voltage.

In Example 29, the subject matter of Example 27 or 28 can optionally include that the read-out circuit (or a reset circuit) is configured to carry out a reset operation to reset a voltage present at the bitline, the reset operation may include: discharging the bitline to the first reference voltage.

In Example 30, the subject matter of any one of Examples 27 to 29 can optionally include that the read-out circuit is configured to perform the reset operation between two consecutive read-out operations.

In Example 31, the subject matter of any one of Examples 27 to 30 can optionally include that the read-out circuit is configured to apply the select voltage at the control terminal of the memory cell and the drain voltage at the drain terminal of the memory cell such that a charging current from the drain terminal through the n-FET to the source terminal is provided.

In Example 32, the subject matter of any one of Examples 27 to 31 can optionally include that the read-out circuit is configured to charge the bitline to a first characteristic voltage in the case that the memory cell is in a first memory state and to a second characteristic voltage in the case that the memory cell is in a second memory state.

In Example 33, the subject matter of any one of Examples 27 to 32 can optionally include that the n-FET is configured to allow for a control of a current flow from the drain region to the source region as a function of a voltage difference between the control terminal and the source terminal.

In Example 34, the subject matter of any one of Examples 27 to 33 can optionally include that the first threshold voltage is more negative than the second threshold voltage.

In Example 35, the subject matter of Examples 33 and 34 can optionally include that the select voltage applied at the control terminal may include a voltage value such that the voltage difference between the control terminal and the source terminal is greater than the first threshold voltage, and optionally greater than the second threshold voltage.

In Example 36, the subject matter of Example 35 can optionally include that the memory cell is configured to charge the bitline in the case that the voltage difference between the control terminal and the source terminal is greater than the threshold voltage (e.g., of the first threshold voltage and the second threshold voltage) associated with the memory state the memory cell is residing in.

In Example 37, the subject matter of Example 36 can optionally include that the memory cell is configured to stop charging the bitline in the case that the voltage difference between the control terminal and the source terminal is equal to or lower than the threshold voltage associated with the memory state the memory cell is residing in.

In Example 38, the subject matter of any one of Examples 34 to 37 can optionally include that the read-out circuit is configured to determine the first memory state for a voltage value of the characteristic voltage more positive than a voltage value of a second reference voltage and to determine the second memory state for a voltage value of the characteristic voltage more negative than the voltage value of the second reference voltage.

In Example 39 the subject matter of Example 29 and optionally further of any one of Examples 30 to 38 can optionally include that the absolute voltage value of the first reference voltage is more negative than the voltage value of the drain voltage.

In Example 40, the subject matter of any one of Examples 29 to 39 can optionally include that the first characteristic voltage may include a voltage value more positive than a voltage value of the second characteristic voltage.

In Example 41, the subject matter of Examples 32 and 40 can optionally include that the first reference voltage may include a voltage value more negative than the first characteristic voltage and optionally more negative than second characteristic voltage.

In Example 42, the subject matter of Example 38 and Example 40 or 41 can optionally include that the second reference voltage may include a voltage value more negative than the voltage value of the first characteristic voltage and more positive than the voltage value of the second characteristic voltage.

In Example 44, the subject matter of Example 38 and any one of Examples 40 to 42 can optionally include that the second reference voltage includes a voltage value within a voltage range defined by the voltage value of the first characteristic voltage and the voltage value of the second characteristic voltage, preferably the second reference voltage includes a voltage value substantially in the middle of the voltage range.

In Example 44, the subject matter of Example 42 or 43 can optionally include that the read-out circuit is configured to determine a first memory state in the case that a voltage value of the characteristic voltage is more positive than a voltage value of the second reference voltage and to determine a second memory state in the case that a voltage value of the characteristic voltage is more negative than the voltage value of the second reference voltage.

In Example 45, the subject matter of Example 38 and optionally further of any one of Examples 39 to 44 can optionally include that determining the memory state of the memory cell includes determining the memory state of the memory cell by comparing the characteristic voltage generated at the bitline to the second reference voltage and to a third reference voltage.

In Example 46, the subject matter of Example 45 can optionally include that the third reference voltage includes a voltage value more positive than the voltage value of the first reference voltage and more negative than the voltage value of the second characteristic voltage.

In Example 47, the subject matter of Example 45 or 46 can optionally include that the read-out circuit is configured to determine a first memory state in the case that a voltage value of the characteristic voltage is more positive than the voltage value of the second reference voltage and to determine a second memory state in the case that a voltage value of the characteristic voltage is more positive than the voltage value of the third reference voltage.

In Example 48, the subject matter of any one of Examples 1 to 26 can optionally include that the memory cell includes a p-type field-effect transistor structure (p-FET), the p-type field-effect transistor including the source region, the drain region, the channel, and the gate structure, and the (or a) read-out operation includes: applying the select voltage at the control terminal of the memory cell and the drain voltage at the drain terminal of the memory cell to discharge the bitline connected to the source terminal of the memory cell to the characteristic voltage, and determining the memory state of the memory cell based on sensing the characteristic voltage.

Example 49 is a memory cell arrangement that may include: a memory cell including an enhancement p-type field-effect transistor (p-FET), the p-FET including a source region connected to or providing a source terminal of the memory cell, a drain region connected to or providing a drain terminal of the memory cell, a channel region extending between the source region and the drain region, and a gate structure connected to or providing a control terminal of the memory cell, the gate structure including a memory element, wherein one or more electrical properties of the channel region (e.g., a current flow from the source region of the p-FET through the channel region of the p-FET to the drain region of the p-FET) are a function of a select voltage applied at the control terminal, a source voltage present at the source terminal, and a memory state of the memory element, a bitline connected to the source terminal of the memory cell; and a read-out circuit configured to carry out a read-out operation to read out the memory state of the memory cell, the read-out operation may include: discharging the bitline to a characteristic voltage by applying the select voltage at the control terminal of the memory cell and a drain voltage at the drain terminal of the memory cell, the characteristic voltage representing the memory state of the memory element, and determining the memory state of the memory cell based on sensing the characteristic voltage.

In Example 50, the subject matter of Example 48 or 49 can optionally include that the read-out circuit (or a reset circuit) is configured to carry out a reset operation to reset a voltage present at the bitline, the reset operation may include: charging the bitline to the first reference voltage.

In Example 51, the subject matter of Example 50 can optionally include that the read-out circuit is configured to carry out the reset operation between two consecutive read-out operations.

In Example 52, the subject matter of any one of Examples 48 to 51 can optionally include that the read-out circuit is configured to apply the select voltage at the control terminal of the memory cell and the drain voltage at the drain terminal of the memory cell such that a discharging current from the source region through the channel of the p-FET to the drain region is provided.

In Example 53, the subject matter of any one of Examples 48 to 52 can optionally include that the read-out circuit is configured to discharge the bitline to a first characteristic voltage for a first memory state of the memory cell and to a second characteristic voltage for a second memory state of the memory cell.

In Example 54, the subject matter of any one of Examples 48 to 53 can optionally include that the memory cell is configured to allow for a control of a current flow from the source region to the drain region as a function of a voltage difference between the control terminal and the source terminal.

In Example 55, the subject matter of any one of Examples 48 to 54 can optionally include that the first threshold voltage is more negative than the second threshold voltage.

In Example 56, the subject matter of Examples 54 and 55 can optionally include that the select voltage applied at the control terminal includes a voltage value such that the voltage difference between the control terminal and the source terminal is greater than the first threshold voltage, and optionally greater than the second threshold voltage.

In Example 57, the subject matter of Example 54 or 56 can optionally include that the memory cell is configured to discharge the bitline in the cast that the voltage difference between the control terminal and the source terminal includes a negative voltage value and/or in the case that the absolute value of the voltage difference between the control terminal and the source terminal is greater than the absolute value of the threshold voltage (e.g., of the first threshold voltage and the second threshold voltage) associated with the memory state the memory cell is residing in.

In Example 58, the subject matter of Example 57 can optionally include that the memory cell is configured to stop discharging the bitline in the case that the absolute value of the voltage difference between the control terminal and the source terminal is equal to or lower than the absolute value of the threshold voltage associated with the memory state the memory cell is residing in.

In Example 59, the subject matter of any one of Examples 48 to 58 can optionally include that the read-out circuit is configured to determine the first memory state in the case that a voltage value of the characteristic voltage is more negative than a voltage value of a second reference voltage and to determine the second memory state in the case that a voltage value of the characteristic voltage is more positive than the voltage value of the second reference voltage.

In Example 60, the subject matter of Example 50 and optionally further of any one of Examples 51 to 59 can optionally include that the absolute voltage value of the drain voltage is more negative than the voltage value of the first reference voltage.

In Example 61, the subject matter of Example 57 and optionally further of any one of Examples 48 to 51 can optionally include that the first characteristic voltage includes a voltage value more negative than a voltage value of the second characteristic voltage.

In Example 62, the subject matter of Examples 50 and 61 can optionally include that the first reference voltage includes a voltage value more positive than the first characteristic voltage and optionally more positive than second characteristic voltage.

In Example 63, the subject matter of Example 59 and Example 61 or 62 can optionally include that the second reference voltage includes a voltage value more positive than the voltage value of the first characteristic voltage and more negative than the voltage value of the second characteristic voltage.

In Example 64, the subject matter of Example 59 and any one of Examples 61 to 63 can optionally include that second reference voltage includes a voltage value within a voltage range defined by the voltage value of the first characteristic voltage and the voltage value of the second characteristic voltage, preferably the second reference voltage includes a voltage value substantially in the middle of the voltage range.

In Example 65, the subject matter of Example 61 or 62 can optionally include that the read-out circuit is configured to determine a first memory state in the case that a voltage value of the characteristic voltage is more negative than a voltage value of the second reference voltage and to determine a second memory state in the case that a voltage value of the characteristic voltage is more positive than the voltage value of the second reference voltage.

In Example 66, the subject matter of Example 59 and optionally further of any one of Examples 60 to 65 can optionally include that determining the memory state of the memory cell includes determining the memory state of the memory cell by comparing the characteristic voltage generated at the bitline to the second reference voltage and to a third reference voltage.

In Example 67, the subject matter of Example 66 can optionally include that the third reference voltage includes a voltage value more negative than the voltage value of the first reference voltage and more positive than the voltage value of the second characteristic voltage.

In Example 68, the subject matter of Example 66 or 67 can optionally include that the read-out circuit is configured to determine a first memory state in the case that a voltage value of the characteristic voltage is more negative than the voltage value of the second reference voltage and to determine a second memory state in the case that a voltage value of the characteristic voltage is more negative than the voltage value of the third reference voltage.

Example 69 is a method for reading a memory cell that may include: generating a characteristic voltage at a bitline connected to a source terminal of the memory cell by applying a select voltage at a control terminal of the memory cell and a drain voltage at a drain terminal of the memory cell, the characteristic voltage representing a memory state of the memory cell, and determining the memory state of the memory cell based on sensing the characteristic voltage.

Example 70 is a method for reading a memory cell that may include: applying a first voltage at a first terminal of the memory cell and a second voltage at a second terminal of the memory cell to provide (e.g., to generate) a characteristic voltage at a bitline connected to a third terminal of the memory cell, the characteristic voltage representing a memory state of the memory cell, and determining the memory state of the memory cell based on sensing the characteristic voltage.

Example 71 is a method for reading a memory cell that may include: charging a bitline connected to a source terminal of the memory cell to a reference voltage, applying a select voltage at a control terminal of the memory cell and a drain voltage at a drain terminal of the memory cell to discharge the bitline to a characteristic voltage, the characteristic voltage representing a memory state of the memory cell, and determining the memory state of the memory cell based on sensing the characteristic voltage.

Example 72 is a method for reading a memory cell that may include: discharging a bitline connected to a source terminal of the memory cell to a reference voltage, applying a select voltage at a control terminal of memory cell and a drain voltage at a drain terminal of the memory cell to charge the bitline to a characteristic voltage, the characteristic voltage representing a memory state of the memory cell, and determining the memory state of the memory cell based on sensing the characteristic voltage.

Example 73 is a method for reading a memory cell including an n-type field-effect transistor structure and a memory element, the method may include: applying a select voltage at a control terminal of memory cell and a drain voltage at a drain terminal of the memory cell to charge a bitline connected to a source terminal of the memory cell via the n-type field-effect transistor structure to a characteristic voltage, the characteristic voltage representing a memory state of the memory element, and determining the memory state of the memory element based on the characteristic voltage.

Example 74 is a method for reading a memory cell including a p-type field-effect transistor structure and a memory element, the method may include: applying a select voltage at a control terminal of the memory cell and a drain voltage at a drain terminal of the memory cell to charge a bitline connected to a source terminal of the memory cell via the p-type field-effect transistor structure to a characteristic voltage, the characteristic voltage representing a memory state of the memory element, and determining the memory state of the memory element based on the characteristic voltage.

Example 75 is a memory cell arrangement that may include: a memory cell, the memory cell including a memory cell including a first terminal, a second terminal, and a third terminal; a bitline connected to the first terminal of the memory cell; and the memory cell being configured to allow a generation of a characteristic voltage at the bitline by applying a third voltage at the third terminal of the memory cell and a second voltage at the second terminal of the memory cell, the characteristic voltage representing a memory state of the memory cell.

In Example 76, the subject matter of Example 75 can optionally include that the memory cell arrangement further includes a read-out circuit, the read-out circuit may be configured to determine the memory state of the memory cell based on sensing the characteristic voltage generated at the bitline.

In Example 77, the subject matter of any one of Examples 1 to 68 may optionally include that generating the characteristic voltage at the bitline includes dynamically charging or discharging the bitline through the memory cell until the memory cell stops being in a conductive state based on its transfer characteristics.

In Example 78, the subject matter of any one of Examples 69 to 74 may optionally include that the method further includes: charging or discharging the bitline to a reference voltage prior to generating the characteristic voltage at the bitline.

It is noted that one or more functions described herein with reference to a memory cell, a remanent polarizable portion, a memory cell arrangement, etc., may be accordingly part of a method, e.g., part of a method for reading a memory cell of the memory cell arrangement. Vice versa, one or more functions described herein with reference to a method, e.g., with reference to a method for reading a memory cell of a memory cell arrangement, may be implemented accordingly in a device or in a part of a device, for example, in a remanent polarizable portion, a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell arrangement, comprising:
   a memory cell comprising a first terminal, a second terminal, and a third terminal;
   the memory cell being configured to allow for a control of a current flow between the second terminal and the first terminal as a function of a first voltage present at the first terminal, a third voltage applied at the third terminal, and a memory state of the memory cell, wherein the memory cell comprises a remanently-polarizable layer and is writable into one of at least two memory states, wherein a first memory state of the at least two memory states has a first threshold voltage associated therewith and wherein a second memory state of the at least two memory states has a second threshold voltage associated therewith, wherein the first threshold voltage is different from the second threshold voltage;
   a bitline connected to the first terminal of the memory cell; and
   a read-out circuit configured to carry out a read-out operation to read out the memory state of the memory cell, the read-out operation comprising:
      generating a characteristic voltage at the bitline by applying the third voltage at the third terminal of the memory cell and a second voltage at the second terminal of the memory cell, wherein the characteristic voltage is a function of the first threshold voltage and the second threshold voltage and represents the memory state of the memory cell, wherein generating the characteristic voltage at the bitline comprises dynamically charging or discharging the bitline through the memory cell, and
      sensing the characteristic voltage to determine the memory state of the memory cell.

2. The memory cell arrangement of claim 1,
   wherein generating the characteristic voltage at the bitline comprises dynamically charging or discharging the bitline through the memory cell until the memory cell stops being in a conductive state based on its transfer characteristics.

3. The memory cell arrangement of claim 1,
   wherein the read-out circuit is further configured to carry out a reset operation to reset a voltage of the bitline to a reference voltage, the reset operation comprising:
   charging or discharging the bitline to the reference voltage.

4. The memory cell arrangement of claim 3,
   wherein the read-out circuit comprises a switch configured to selectively connect the bitline to a voltage source to charge the bitline to the reference voltage or to a voltage sink to discharge the bitline to the reference voltage.

5. The memory cell arrangement of claim 3,
   wherein the read-out circuit is configured to carry out the reset operation prior to the read-out operation and/or subsequent to the read-out operation.

6. The memory cell arrangement of claim 3,
   wherein the read-out circuit is configured to carry out a first read-out operation at a first time and a second read-out operation at a second time different from the first time; and
   wherein the read-out circuit is configured to carry out the reset operation at a third time between the first time and the second time.

7. The memory cell arrangement of claim 1,
   wherein generating a characteristic voltage comprises charging or discharging the bitline to a first characteristic voltage in the case that the memory cell is in a first memory state and charging or discharging the bitline to a second characteristic voltage in the case that the memory cell is a second memory state, wherein the first characteristic voltage is different from the second characteristic voltage; and
   wherein determining the memory state of the memory cell comprises determining the memory state of the memory cell by determining whether the first characteristic voltage or the second characteristic voltage is generated at the bitline.

8. The memory cell arrangement of claim 1,
   wherein the memory cell comprises an n-type field-effect transistor structure, the n-type field-effect transistor structure comprising:
   a source region connected to or providing the first terminal of the memory cell, the source region being n-type doped,
   a drain region connected to or providing the second terminal of the memory cell, the drain region being n-type doped,
   a channel region extending between the source region and the drain region, the channel region being p-type doped, and
   a gate structure connected to or providing the third terminal of the memory cell, the gate structure comprising a memory element;
   wherein one or more electrical properties of the channel region are a function of a select voltage applied at the third terminal, a source voltage present at the first terminal, and a memory state of the memory element; and
   wherein generating the characteristic voltage at the bitline comprises charging the bitline by applying the select voltage at the third terminal of the memory cell and the second voltage at the second terminal of the memory cell.

9. The memory cell arrangement of claim 8,
wherein the read-out circuit is further configured to carry out a reset operation to reset a voltage of the bitline to a reference voltage, the reset operation comprising:
discharging the bitline to the reference voltage.

10. The memory cell arrangement of claim 9,
wherein determining the memory state of the memory cell comprises comparing the characteristic voltage generated at the bitline to at least one comparator reference voltage.

11. The memory cell arrangement of claim 1,
wherein the memory cell further comprises a p-type field-effect transistor structure, the p-type field-effect transistor structure comprising:
a source region connected to or providing the first terminal of the memory cell, the source region being p-type doped,
a drain region connected to or providing the second terminal of the memory cell, the drain region being p-type doped,
a channel region extending between the source region and the drain region, the channel region being n-type doped, and
a gate structure connected to or providing the third terminal of the memory cell, the gate structure comprising a memory element;
wherein one or more electrical properties of the channel region are a function of a select voltage applied at the third terminal, a source voltage present at the first terminal, and a memory state of the memory element; and
wherein generating the characteristic voltage at the bitline comprises discharging the bitline by applying the select voltage at the third terminal of the memory cell and the second voltage at the second terminal of the memory cell.

12. The memory cell arrangement of claim 11,
wherein the read-out circuit is further configured to carry out a reset operation to reset a voltage of the bitline to a reference voltage, the reset operation comprising:
charging the bitline to the reference voltage.

13. The memory cell arrangement of claim 8,
wherein the select voltage applied at the third terminal comprises a voltage value such that a voltage difference between the third terminal and the first terminal is greater than a first threshold voltage associated with a first memory state of the memory cell; and/or
such that a voltage difference between the third terminal and the first terminal is greater than a second threshold voltage associated with a second memory state of the memory cell.

14. The memory cell arrangement of claim 11,
wherein determining the memory state of the memory cell comprises comparing the characteristic voltage generated at the bitline to at least one comparator reference voltage.

15. A memory cell arrangement, comprising:
a memory cell comprising a first terminal, a second terminal, and a third terminal, wherein the memory cell comprises a remanently-polarizable layer and is writable into one of at least two memory states, wherein a first memory state of the at least two memory states has a first threshold voltage associated therewith and wherein a second memory state of the at least two memory states has a second threshold voltage associated therewith, wherein the first threshold voltage is different from the second threshold voltage;
a bitline connected to the first terminal of the memory cell; and
the memory cell being configured to allow a generation of a characteristic voltage at the bitline by applying a third voltage at the third terminal of the memory cell and a second voltage at the second terminal of the memory cell, wherein the characteristic voltage is a function of the first threshold voltage and the second threshold voltage and represents a memory state of the memory cell;
wherein the generation of the characteristic voltage at the bitline comprises dynamically charging or discharging the bitline through the memory cell.

16. The memory cell arrangement of claim 15, further comprising a read-out circuit, the read-out circuit configured to determine the memory state of the memory cell based on sensing the characteristic voltage generated at the bitline.

17. A method for reading a memory cell, comprising:
generating a characteristic voltage at a bitline connected to a first terminal of the memory cell by applying a second voltage at a second terminal of the memory cell, and a select voltage at a third terminal of the memory cell, wherein the memory cell comprises a remanently-polarizable layer and is writable into one of at least two memory states, wherein a first memory state of the at least two memory states has a first threshold voltage associated therewith and wherein a second memory state of the at least two memory states has a second threshold voltage associated therewith, wherein the first threshold voltage is different from the second threshold voltage, wherein the characteristic voltage is a function of the first threshold voltage and the second threshold voltage and represents a memory state of the memory cell, and wherein generating the characteristic voltage at the bitline comprises dynamically charging or discharging the bitline through the memory cell, and
determining the memory state of the memory cell based on sensing the characteristic voltage.

18. The method of claim 17, further comprising:
charging or discharging the bitline to a reference voltage prior to generating the characteristic voltage at the bitline.

* * * * *